(12) United States Patent
Chao et al.

(10) Patent No.: US 12,174,526 B2
(45) Date of Patent: Dec. 24, 2024

(54) PELLICLE FOR AN EUV LITHOGRAPHY MASK AND A METHOD OF MANUFACTURING THEREOF

(71) Applicant: TAIWAN SEMICONDUCTOR MANUFACTURING COMPANY, LTD., Hsinchu (TW)

(72) Inventors: Tzu-Ang Chao, Hsinchu (TW); Chao-Ching Cheng, Hsinchu (TW); Han Wang, Hsinchu (TW); Ming-Yang Li, Hsinchu (TW); Gregory Michael Pitner, Sunnyvale, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 432 days.

(21) Appl. No.: 17/576,912

(22) Filed: Jan. 14, 2022

(65) Prior Publication Data

US 2023/0044415 A1    Feb. 9, 2023

Related U.S. Application Data

(60) Provisional application No. 63/230,576, filed on Aug. 6, 2021.

(51) Int. Cl.
*G03F 1/62* (2012.01)
*G03F 1/64* (2012.01)

(52) U.S. Cl.
CPC . *G03F 1/62* (2013.01); *G03F 1/64* (2013.01)

(58) Field of Classification Search
CPC ..................................... G03F 1/62; G03F 1/64
USPC ............................................................. 430/5
See application file for complete search history.

(56) References Cited

U.S. PATENT DOCUMENTS

| 10,712,659 | B2 | 7/2020 | Gallagher et al. |
| 11,092,886 | B2 | 8/2021 | Timmermans et al. |
| 11,599,019 | B2 | 3/2023 | Timmermans et al. |
| 11,860,534 | B2* | 1/2024 | Chao .................... G03F 1/64 |
| 2020/0272047 | A1 | 8/2020 | Chatterjee et al. |
| 2021/0019255 | A1 | 1/2021 | Akin et al. |
| 2022/0144641 | A1 | 5/2022 | Lima |
| 2022/0276553 | A1 | 9/2022 | Nikipelov et al. |

FOREIGN PATENT DOCUMENTS

| CN | 108873596 A | 11/2018 |
| CN | 108878259 A | 11/2018 |
| JP | 2019168502 A | 10/2019 |
| JP | 2021-107916 A | 7/2021 |
| TW | 202106617 A | 2/2021 |
| TW | 202117441 A | 5/2021 |
| WO | 2020/243112 A1 | 12/2020 |
| WO | 2021/037662 A1 | 3/2021 |

OTHER PUBLICATIONS

Jonathan Kim et al., "Synthesis and Characterization of Transition Metal Dichalcogenide and Carbon Nanotube Coaxial Heterostructures," Transfer-to-Excellence Summer Research Program (2017) https://e3s-center.berkeley.edu/education-diversity/education/undergraduate/lte-transfer-excellence-summer-research-program/lte-program-archive-p/2017-2/.

* cited by examiner

*Primary Examiner* — Christopher G Young
(74) *Attorney, Agent, or Firm* — STUDEBAKER & BRACKETT PC

(57) ABSTRACT

A pellicle for an EUV photo mask includes a first layer, a second layer, and a main membrane disposed between the first layer and second layer. The main membrane includes a plurality of co-axial nanotubes, each of which includes an inner tube and one or more outer tubes surrounding the inner tube, and two of the inner tube and one or more outer tubes are made of different materials from each other.

20 Claims, 18 Drawing Sheets

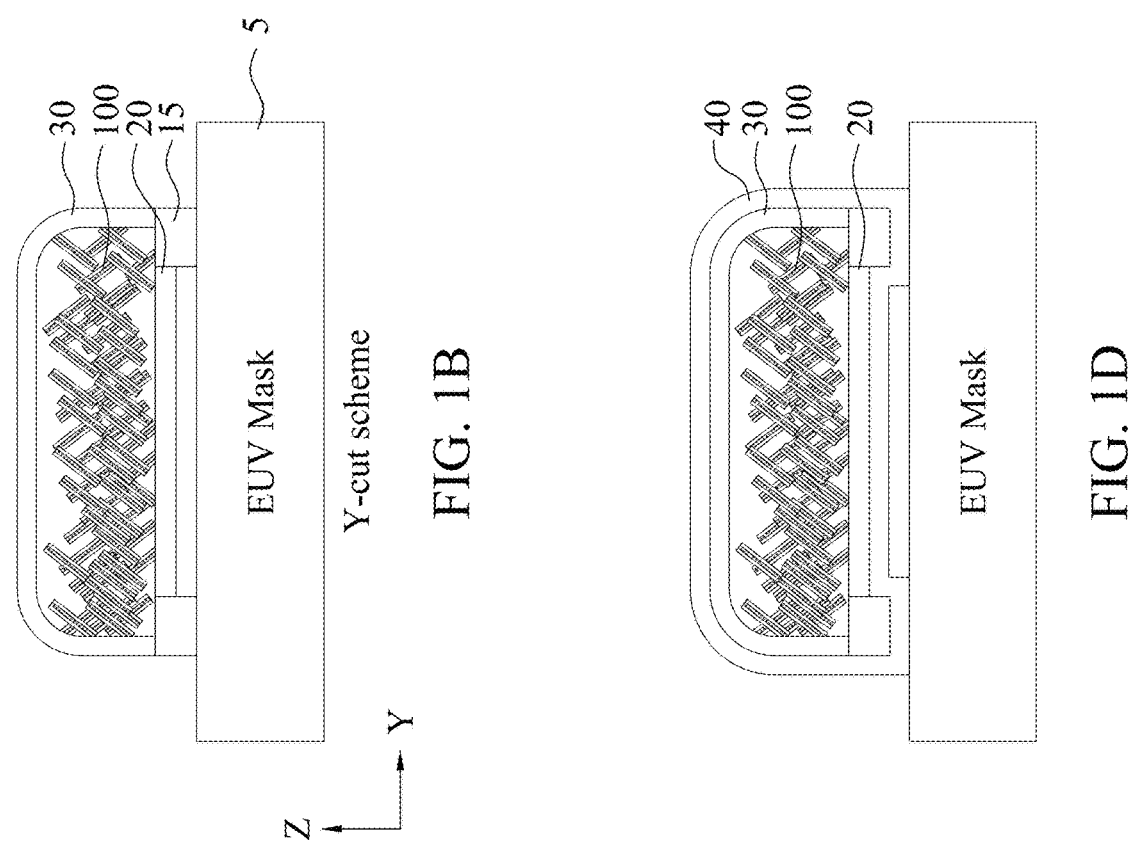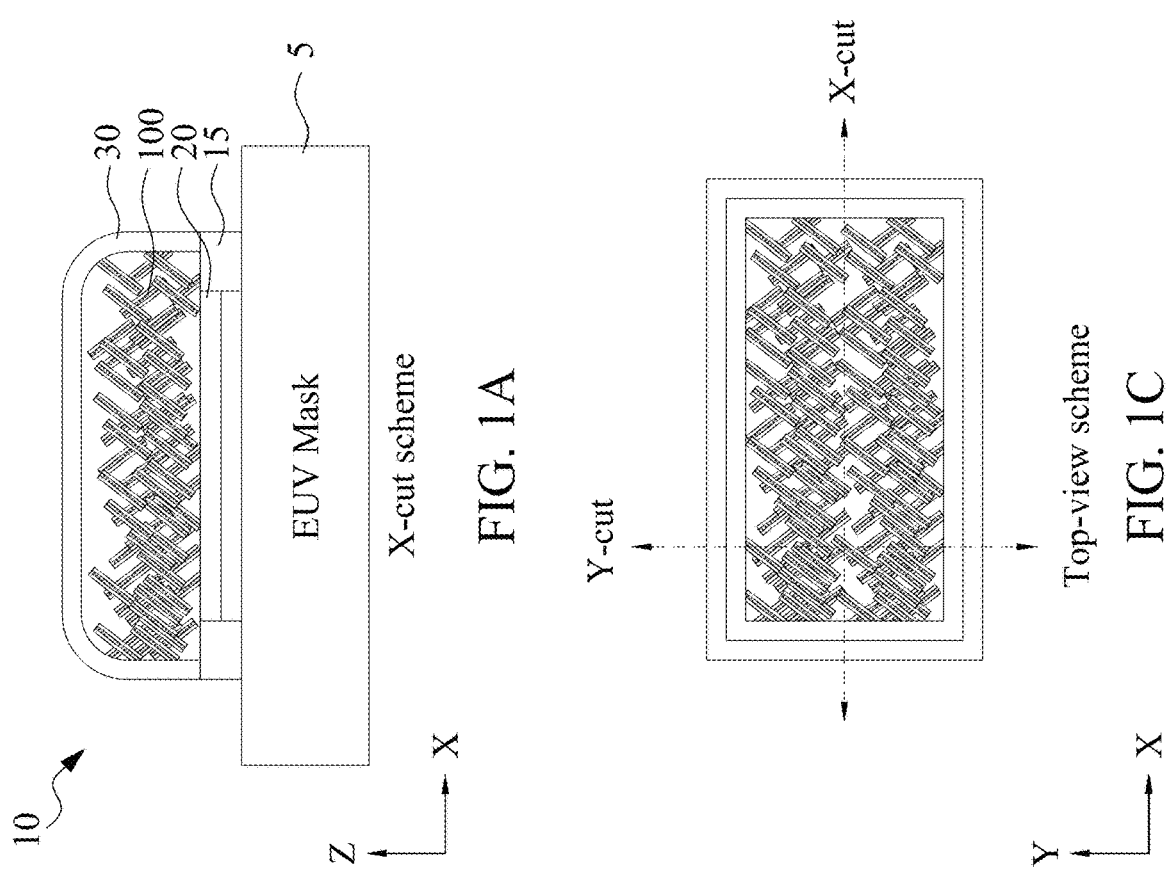

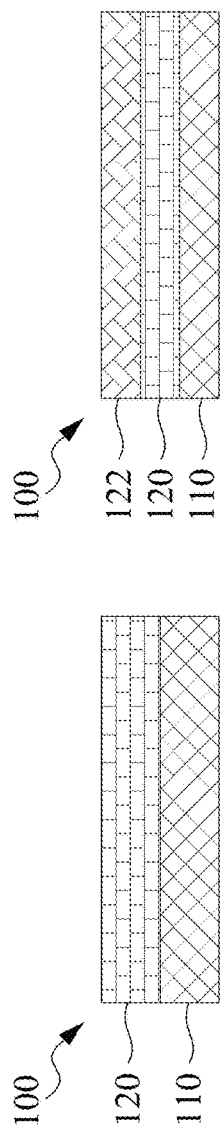
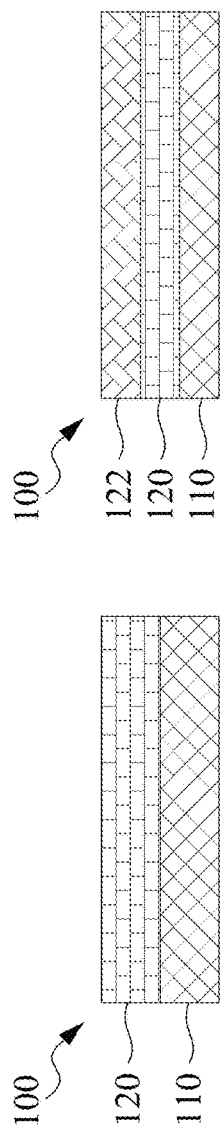
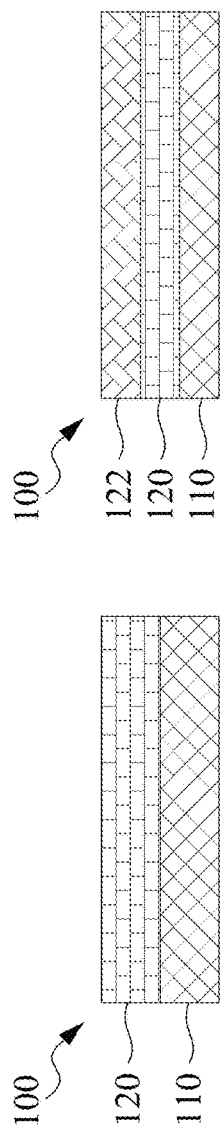
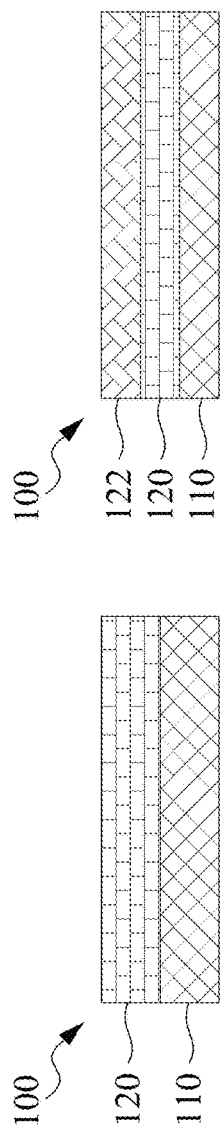

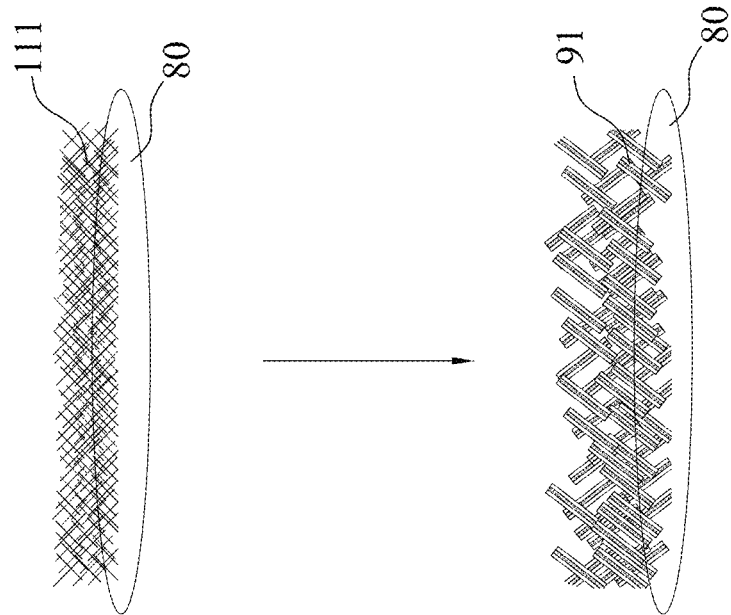

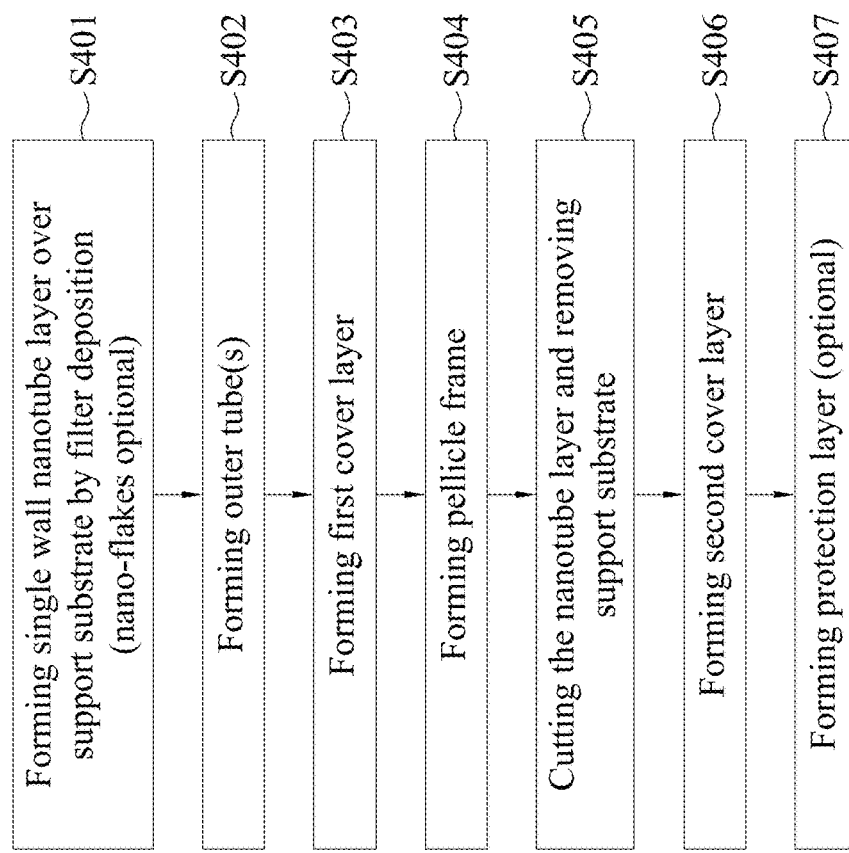

PELLICLE FOR AN EUV LITHOGRAPHY MASK AND A METHOD OF MANUFACTURING THEREOF

RELATED APPLICATION

This application claims priority of U.S. Provisional Patent Application No. 63/230,576 filed on Aug. 6, 2021, the entire contents of which are incorporated herein by reference.

BACKGROUND

A pellicle is a thin transparent film stretched over a frame that is glued over one side of a photo mask to protect the photo mask from damage, dust and/or moisture. In EUV lithography, a pellicle having a high transparency in the EUV wavelength region, a high mechanical strength and a low thermal expansion is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 1C and 1D show various views of a pellicle for an EUV photo mask in accordance with an embodiment of the present disclosure.

FIGS. 4A, 4B, 4C, 4D, 4E, 4F, 4G, 4H, 4I and 4J show various views of network membranes of a pellicle for an EUV photo mask in accordance with embodiments of the present disclosure.

FIG. 16A shows a cross sectional view of one of the various stages for manufacturing a pellicle for an EUV photo mask in accordance with an embodiment of the present disclosure.

FIG. 16B shows cross sectional views of the various stages for manufacturing a pellicle for an EUV photo mask in accordance with an embodiment of the present disclosure.

FIGS. 18A, 18B, 18C, 18D, 18E and 18F show flowcharts of manufacturing a pellicle for an EUV photo mask in accordance with embodiments of the present disclosure.

DETAILED DESCRIPTION

Figure 2C:
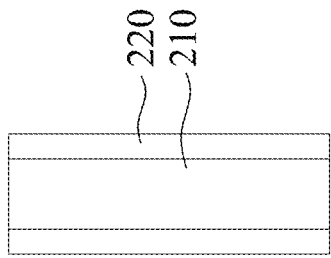
FIGS. 2A, 2B, 2C and 2D show various views of multi-wall nanotubes in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

EUV lithography is one of the crucial techniques for extending Moore's law. However, due to wavelength scaling from 193 nm (ArF) to 13.5 nm, the EUV light source suffers from strong power decay due to environment adsorption. Even though a stepper/scanner chamber is operated under vacuum to prevent strong EUV adsorption by gas, maintaining a high EUV transmittance from the EUV light source to a wafer is still an important factor in EUV lithography.

A pellicle generally requires a high transparency and a low reflectivity. In UV or DUV lithography, the pellicle film is made of a transparent resin film. In EUV lithography, however, a resin based film would not be acceptable, and a non-organic material, such as a polysilicon, silicide or metal film, is used.

Carbon nanotubes (CNTs) are one of the materials suitable for a pellicle for an EUV reflective photo mask, because CNTs have a high EUV transmittance of more than 96.5%. Generally, a pellicle for an EUV reflective mask requires the following properties: (1) Long life time in a rich hydrogen radical operation environment in an EUV stepper/scanner; (2) Strong mechanical strength to minimize the sagging effect during vacuum pumping and venting operations; (3) A high or perfect blocking property for particles larger than about 20 nm (killer particles); and (4) A good heat dissipation to prevent the pellicle from being burnt out by EUV radiation.

In the present disclosure, a pellicle for an EUV photo mask includes a network membrane having a plurality of multiwall nanotubes and a two-dimensional material layer covering the network membrane. Such a pellicle has a high EUV transmittance, improved mechanical strength, blocks killer particles from falling on an EUV mask, and/or has improved durability.

FIGS. 1A, 1B and 1C show an EUV pellicle 10 mounted on an EUV reflective mask 5 in accordance with an embodiment of the present disclosure. FIG. 1A is a cross sectional view in the X direction, FIG. 1B is a cross sectional view in the Y direction, and FIG. 1C is a top (plan) view.

In some embodiments, a pellicle 10 for an EUV reflective mask includes a first cover layer 20, a second cover layer 30 and a main network membrane 100 disposed between the first cover layer 20 and the second cover layer 30. In some embodiments, the main network layer includes a plurality of multiwall nanomaterials, such as nanotubes and/or nanoflakes of two dimensional materials. In some embodiments, a support frame 15 is attached to the main network membrane 100 and/or the first cover layer 20 to maintain a space between the membrane of the pellicle and the EUV mask 5 (pattern area) when mounted on the EUV mask 5. One of or both of the first cover layer 20 and the second cover layer 30 include a two-dimensional material in which one or more two-dimensional layers are stacked. Here, a "two-dimensional" layer refers to one or a few crystalline layers of an atomic matrix or a network having thickness within the range of about 0.1-5 nm, in some embodiments.

The support frame 15 of the pellicle is attached to the surface of the EUV photo mask 5 with an appropriate bonding material. In some embodiments, the bonding material is an adhesive, such as an acrylic or silicon based glue or an A-B cross link type glue. The size of the frame structure is larger than the area of the black borders of the EUV photo mask so that the pellicle covers not only the circuit pattern area of the photo mask but also the black borders.

In some embodiments, the two-dimensional materials of the first cover layer 20 and the second cover layer 30 are the same or different from each other. In some embodiments, the first cover layer includes a first two-dimensional material and the second cover layer includes a second two-dimensional material.

In some embodiments, the two-dimensional material for the first cover layer 20 and/or the second cover layer 30 includes at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a total thickness of each of the first cover layer 20 and the second cover layer 30 is in a range from about 0.3 nm to about 3 nm and is in a range from about 0.5 nm to about 1.5 nm in other embodiments. In some embodiments, a number of the two-dimensional layers of each of the two-dimensional materials of the first and/or second cover layers is 1 to about 20, and is 2 to about 10 in other embodiments. When the thickness and/or the number of layers is greater than these ranges, EUV transmittance of the pellicle 10 may be decreased and when the thickness and/or the number of layers is smaller than these ranges, mechanical strength of the pellicle may be insufficient.

In some embodiments, as shown in FIGS. 1A and 1B, the first cover layer 20 and the second cover layer 30 are sealed at the periphery thereof to fully encapsulate the main network membrane 100. In some embodiments, the first cover layer 20 and the second cover layer 30 form a vacuum sealed structure. In some embodiments, a pressure inside the vacuum sealed structure is about 0.01 Pa to about 100 Pa. If the inside pressure is too high, for example, higher than an inside pressure of an EUV lithography apparatus in operation, the pellicle may rupture due to the pressure difference. In some embodiments, one or more vent holes are formed at the first cover layer 20 and/or the second cover layer 30.

In some embodiments, a protection layer 40 is further disposed over the first cover layer 20, the second cover layer 30 and the support frame 15, as shown in FIG. 1D. In some embodiments, the protection layer 40 includes at least one layer of an oxide, such as $HfO_2$, $Al_2O_3$, $ZrO_2$, $Y_2O_3$, or $La_2O_3$. In some embodiments, the protection layer 40 includes at least one layer of non-oxide compounds, such as $B_4C$, YN, $Si_3N_4$, BN, NbN, RuNb, $YF_3$, TiN, or ZrN. In some embodiments, the protection layer 40 includes at least one metal layer made of, for example, Ru, Nb, Y, Sc, Ni, Mo, W, Pt, or Bi. In some embodiments, the protection layer 40 is a single layer, and in other embodiments, two or more layers of these materials are used as the protection layer 40. In some embodiments, a thickness of the protection layer is in a range from about 0.1 nm to about 5 nm, and is in a range from about 0.2 nm to about 2.0 nm in other embodiments. When the thickness of the protection layer 40 is greater than these ranges, EUV transmittance of the pellicle 10 may be decreased and when the thickness of the protection layer 40 is smaller than these ranges, the mechanical strength of the pellicle may be insufficient.

By using the first and/or second cover layer and/or the protection layer, which do not have holes, such as an opening and/or spaces greater than about 10-20 nm, it is possible to fully block killer particles larger than about 20 nm from passing through the main network membrane 100 and falling on the surface of the EUV mask 5.

Figure 2B:
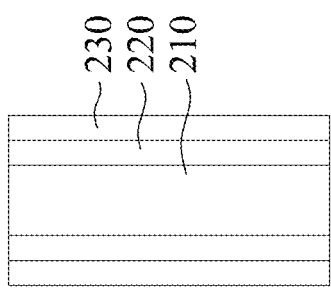
Figure 2D:
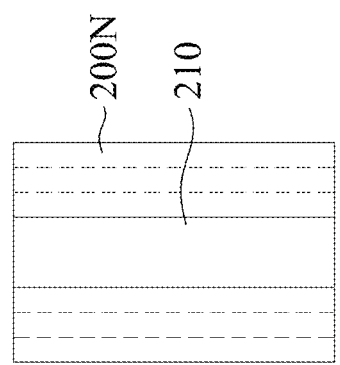
Figure 2A:
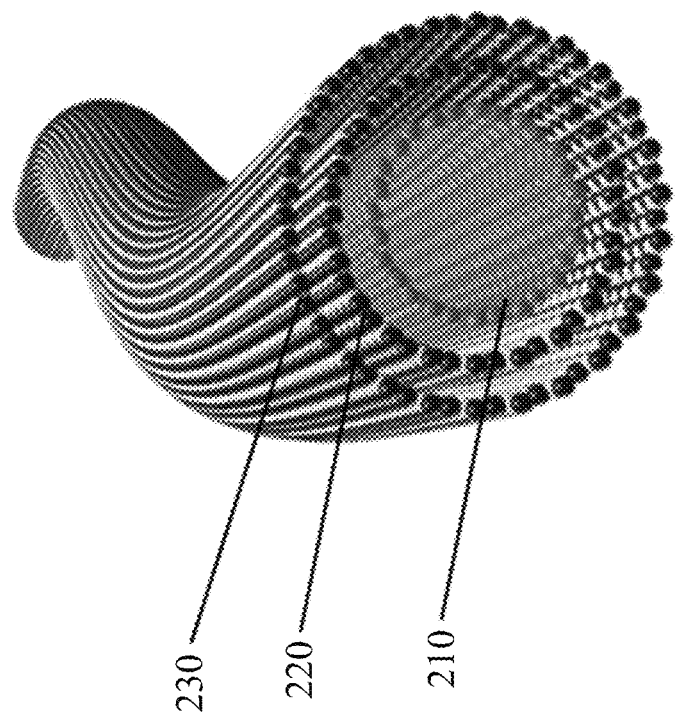

In some embodiments, the nanotubes in the main network membrane 100 include multiwall nanotubes, which are also referred to as co-axial nanotubes. FIG. 2A shows a perspective view of a multiwall co-axial nanotube having threes tubes 210, 220 and 230 and FIG. 2B shows a cross sectional view thereof. In some embodiments, the inner tube 210 is a carbon nanotube, and two outer tubes 220 and 230 are boron nitride nanotubes.

The number of tubes of the multiwall nanotubes is not limited to three. In some embodiments, the multiwall nanotube has two co-axial nanotubes as shown in FIG. 2C, and in other embodiments, the multiwall nanotube includes the innermost tube 210 and the first to N-th nanotubes including the outermost tube 200N, where N is a natural number from 1 to about 20, as shown in FIG. 2D. In some embodiments, N is up to 10 or up to 5. In some embodiments, at least one of the first to the N-th outer layers is a nanotube coaxially surrounding the innermost nanotube 210. In some embodiments, two of the innermost nanotubes 210 and the first to the N-th outer layers 220, 230, . . . 200N are made of different materials from each other. In some embodiments, N is at least two (i.e., three or more tubes), and two of the innermost nanotubes 210 and the first to the N-th outer tubes 220, 230, . . . 200N are made of the same materials. In other embodiments, three of the innermost nanotubes 210 and the first to the N-th outer tubes 220, 230, . . . 200N are made of different materials from each other.

In some embodiments, each of the nanotubes of the multiwall nanotube is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In some embodiments, at least two of the tubes of the multiwall nanotube are made of different material from each other. In some embodiments, adjacent two layers (tubes) of the multiwall nanotube are made of different material from each other.

In some embodiments, the multiwall nanotube includes three co-axially layered tubes made of different materials from each other. In other embodiments, the multiwall nanotube includes three co-axially layered tubes, in which the innermost tube (first tube) and the second tube surrounding the innermost tube are made of different materials from each other, and the third tube surrounding the second tube is made of the same material as or different material from the innermost tube or the second tube.

In some embodiments, the multiwall nanotube includes four co-axially layered tubes each made of different materials A, B or C. In some embodiments, the materials of the four layers are from the innermost (first) tube to the fourth tube, A/B/A/A, AB/AB, AB/A/C, A/B/B/A, A/B/B/B, A/B/B/C, AB/C/A, A/B/C/B, or A/B/C/C.

In some embodiments, all the tubes of the multiwall nanotube are crystalline nanotubes. In other embodiments, one or more tubes are a non-crystalline (e.g., amorphous) layer wrapping around the one or more inner tubes. In some embodiments, the outermost tube is made of, for example, a layer of $HfO_2$, $Al_2O_3$, $ZrO_2$, $Y_2O_3$, $La_2O_3$, $B_4C$, YN, $Si_3N_4$, BN, NbN, RuNb, $YF_3$, TiN, ZrN, Ru, Nb, Y, Sc, Ni, Mo, W, Pt, or Bi. In some embodiments, the outermost layer is made of the same material as the protection layer 40.

In some embodiments, a diameter of the innermost nanotube is in a range from about 0.5 nm to about 20 nm and is in a range from about 1 nm to about 10 nm in other embodiments. In some embodiments, a diameter of the multiwall nanotubes (i.e., diameter of the outermost tube) is in a range from about 3 nm to about 40 nm and is in a range from about 5 nm to about 20 nm in other embodiments. In some embodiments, a length of the multiwall nanotube is in a range from about 0.5 µm to about 50 µm and is in a range from about 1.0 µm to about 20 µm in other embodiments.

Figure 3C:
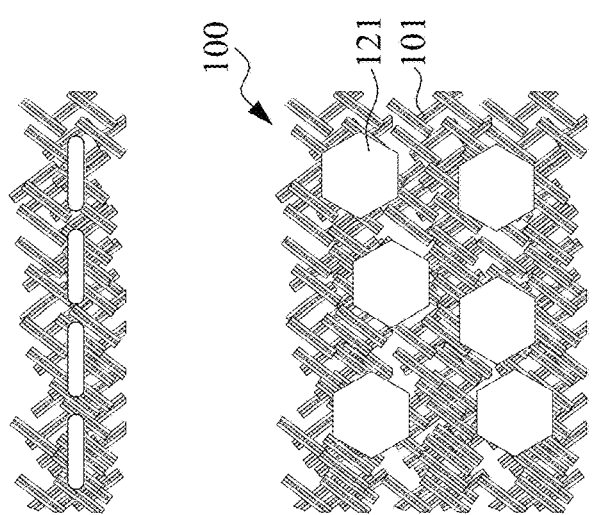
FIGS. 3A, 3B and 3C show various views of network membranes of a pellicle for an EUV photo mask in accordance with embodiments of the present disclosure.
Figure 3B:
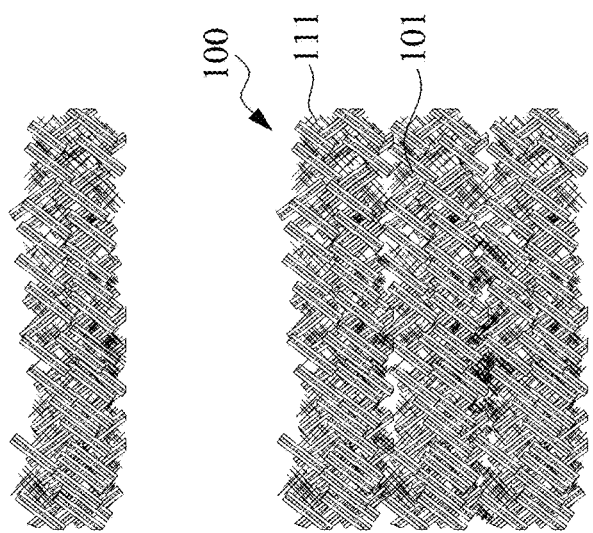
Figure 3A:
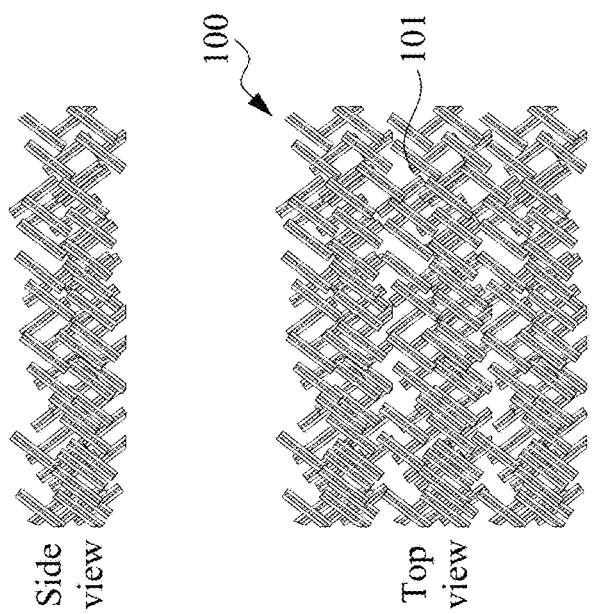

FIGS. 3A, 3B and 3C show various network membranes 100 of a pellicle for an EUV photo mask in accordance with embodiments of the present disclosure.

In some embodiments, the network membrane 100 includes a plurality of multiwall nanotubes 101. In some embodiments, the plurality of multiwall nanotubes are randomly arranged to form a network structure. In some embodiments, the plurality of multiwall nanotubes include only one type of multiwall nanotubes in terms of material and structure (number of layers). In other embodiments, the plurality of multiwall nanotubes include two or more types of multiwall nanotubes in terms of material and structure (number of layers). For example, the plurality of multiwall nanotubes include a first type of multiwall nanotubes, e.g., two wall nanotubes, and a second type of multiwall nanotubes, e.g., three wall nanotubes; a first type of multiwall nanotubes, e.g., two wall nanotubes of layer A and layer B, and a second type of multiwall nanotubes, e.g., two wall nanotubes of layer A and layer C.

In some embodiments, the main network layer 100 includes a plurality of one or more types of multiwall nanotubes 101, and a plurality of one or more types of single wall nanotubes 111, as shown in FIG. 3B. In some embodiments, an amount (weight) of the single wall nanotubes 111 is smaller than an amount of the multiwall nanotubes 101. In some embodiments, an amount (weight) of the single wall nanotubes 111 is greater than an amount of the multiwall nanotubes 101. In some embodiments, the amount (weight) of the multiwall nanotubes 101 is at least about 20 wt % with respect to a total weight of the network membrane 100, or is at least 40 wt % in other embodiments. When the amount of the multiwall nanotubes is smaller than these ranges, sufficient strength of the network membrane may not be obtained.

In some embodiments, the main network membrane 100 includes a plurality of multiwall nanotubes 101 and a plurality of flakes 121 (nano-flakes) made of a two-dimensional material in which one or more two-dimensional layers are stacked, as shown in FIG. 3C.

In some embodiments, the two-dimensional material flakes 121 include at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a thickness of two-dimensional material flakes 121 is in a range from about 0.3 nm to about 3 nm and is in a range from about 0.5 nm to about 1.5 nm in other embodiments. In some embodiments, a number of the two-dimensional layers of two-dimensional material flakes 121 is 1 to about 20, and is 2 to about 10 in other embodiments. When the thickness and/or the number of layers is greater than these ranges, EUV transmittance of the pellicle 10 may be decreased and when the thickness and/or the number of layers is smaller than these ranges, mechanical strength of the pellicle may be insufficient.

In some embodiments, the shape of the two-dimensional material flakes 121 is random. In other embodiments, the shape of the two-dimensional material flakes 121 is triangular or hexagonal. In certain embodiments, the shape of the two-dimensional material flakes 121 is a triangle formed by three atoms or a hexagon formed by six atoms. In some embodiments, a size (area) of each of the two-dimensional material flakes 121 is in a range from about 10 nm$^2$ to about 10 µm$^2$ and is in a range from about 100 nm$^2$ to about 1 µm$^2$ in other embodiments. In some embodiments, the two-dimensional material flakes 121 are embedded in or mixed with a plurality of nanotubes 101.

In some embodiments, an amount (weight) of the two-dimensional material flakes 121 is in a range from about 5 wt % to about 30 wt % with respect to a total weight of the network membrane 100, and is in a range from about 10 wt % to about 20 wt % in other embodiments. When the amount of two-dimensional material flakes is greater than these ranges, the EUV transmittance of the pellicle 10 may be decreased and when the amount of two-dimensional material flakes is smaller than these ranges, the mechanical strength of the pellicle may be insufficient. In some embodiments, the plurality of nanotubes are multiwall nanotubes similar to FIG. 3A and in other embodiments, the plurality of nanotubes are mixture of single wall nanotubes and multiwall nanotubes similar to FIG. 3B.

FIGS. 4A, 4B, 4C, 4D, 4E, 4F, 4G, 4H, 4I and 4J show various views of network membranes of a pellicle for an EUV photo mask in accordance with embodiments of the present disclosure. In some embodiments, the network membrane 100 has a single layer structure or a multilayer structure.

In some embodiments, the network membrane 100 has a single layer 110 of a plurality of multiwall nanotubes as shown in FIG. 4A. In some embodiments, the network membrane 100 has two layers of different type multiwall nanotubes 110 and 112, as shown in FIG. 4B. The thickness of the layer 110 and layer 112 are the same or different from each other. In some embodiments, the network membrane 100 has three layers of nanotubes 110, 112 and 114, as shown in FIG. 4C. At least adjacent layers are different types (e.g., material and/or wall numbers) in some embodiments. The thickness of the layers 110, 112 and 114 are the same or different from each other. In some embodiments, a single nanotube layer is disposed between two multiwall nanotube layers. In some embodiments, the network membrane 100 has a single layer 115 of a mixture of different type nanotubes, as shown in FIG. 4D.

In some embodiments, the network membrane 100 has a nanotube layer 110 and a two-dimensional flake layer 120, as shown in FIGS. 4E and 4F. The thickness of the layer 110 and layer 120 are the same or different from each other. The layer 110 can be a mixed layer 115 as shown in FIG. 4D. In some embodiments, the network membrane 100 has a two-dimensional flake layer 120 disposed between a first nanotube layer 110 and a second nanotube layer 112, as shown in FIG. 4G. In some embodiments, the first and second nanotube layers are of the same type or different types. In some embodiments, the network membrane 100 has a nanotube layer 110 disposed between a first two-dimensional flake layer 120 and a second two-dimensional flake layer 122, as shown in FIG. 4H. In some embodiments, the first and second two-dimensional flake layers are made of the same material or different materials from each other. In some embodiments, the network membrane 100 has a nanotube layer 110, a first two-dimensional flake layer 120 over the nanotube layer 110 and a second two-dimensional flake layer 122 disposed over the first two-dimensional flake layer 120 as shown in FIG. 4I. In some embodiments, the network membrane 100 has one or more nanotube layers of the same type or different types and one or more two-dimensional flake layers of the same material or different materials. In some embodiments, the network membrane 100 has a single layer 125 of a mixture of nanotubes and two-dimensional flakes, as shown in FIG. 4J.

Figure 5B:
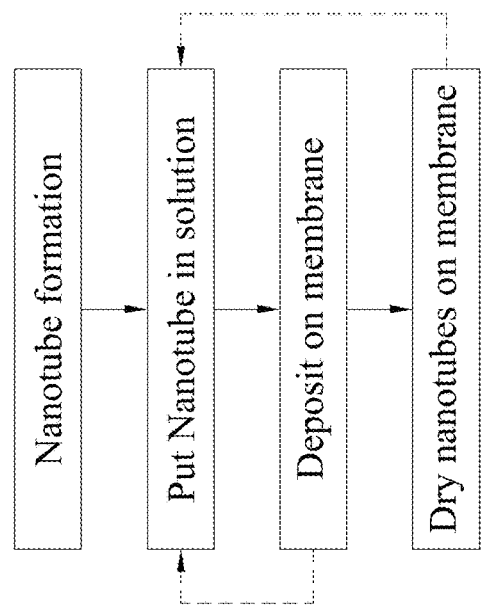
FIG. 5B shows a flow chart thereof and FIGS. 5C and 5D show manufacturing processes of multiwall nanotubes, in accordance with an embodiment of the present disclosure.
Figure 5A:
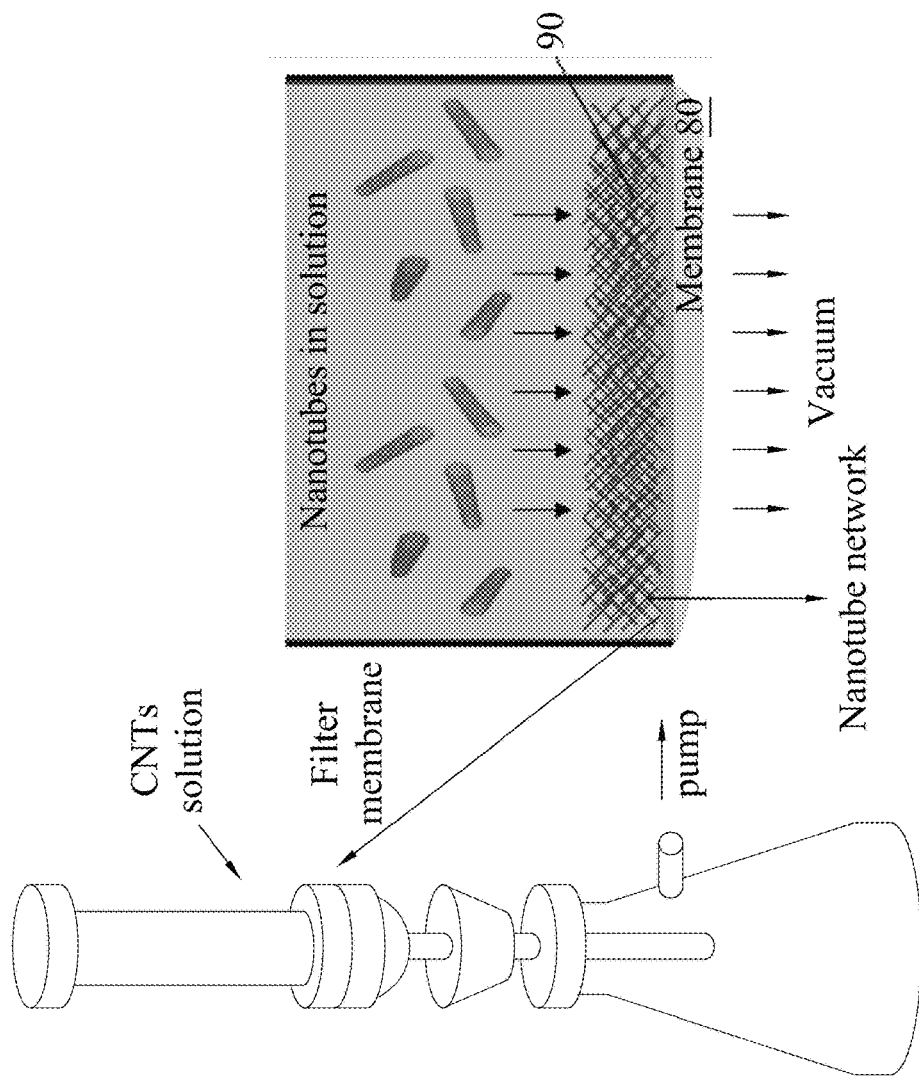
FIG. 5A shows a manufacturing process of a network membrane.

FIG. 5A shows a manufacturing process of a network membrane and FIG. 5B shows a flow chart thereof in accordance with an embodiment of the present disclosure.

In some embodiments, nanotubes are dispersed in a solution as shown in FIG. 5A. The solution is a solvent, including water or an organic solvent, such as sodium dodecyl sulfate (SDS). The nanotubes are one type or two or more types of nanotubes (material and/or wall numbers). In some embodiments, the nanotubes are single wall nanotubes. In some embodiments, single wall nanotubes are carbon nanotubes formed by various methods, such as arc-discharge, laser ablation or chemical vapor deposition (CVD) methods. Similarly, single wall BN nanotubes and single wall TMD nanotubes are also formed by a CVD process.

As shown in FIG. 5A, a support membrane is placed between a chamber or a cylinder in which the nanotube dispersed solution is disposed and a vacuum chamber. In some embodiments, the support membrane is an organic or inorganic porous or mesh material. In some embodiments, the support membrane is woven or non-woven fabric. In some embodiments, the support membrane has a circular shape in which a pellicle size or a 150 mm×150 mm square (the size of an EUV mask) can be placed.

As shown in FIG. 5A, the pressure in the vacuum chamber is reduced so that a pressure is applied to the solvent in the chamber or cylinder. Since the mesh or pore size of the support membrane is sufficiently smaller than the size of the nanotubes, the nanotubes are captured by the support membrane while the solvent passes through the support membrane. The support membrane on which the nanotubes are deposited is detached from the filtration apparatus of FIG. 5A and then is dried. In some embodiments, the deposition by filtration is repeated so as to obtain a desired thickness of the nanotube network layer as shown in FIG. 5B. In some embodiments, after the deposition of the nanotubes in the solution, other nanotubes are dispersed in the same or new solution and the filter-deposition is repeated. In other embodiments, after the nanotubes are dried, another filter-deposition is performed. In the repetition, the same type of nanotubes is used in some embodiments, and different types of nanotubes are used in other embodiments.

Figure 5C:
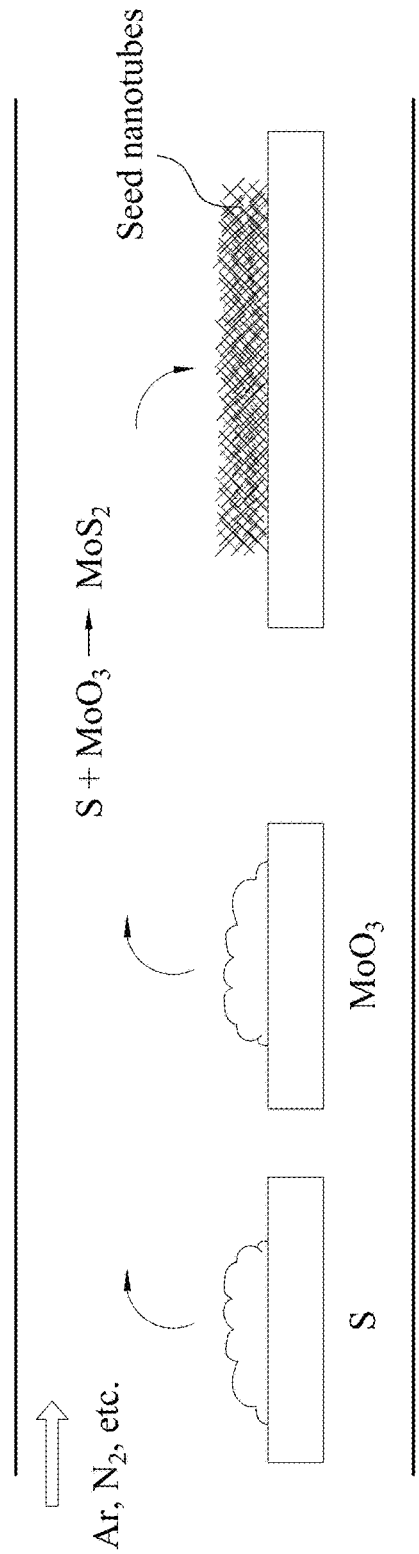

In some embodiments, the nanotubes dispersed in the solution include multiwall nanotubes. In some embodiments, multiwall nanotubes are formed by CVD by using single wall nanotubes as seeds, as shown in FIG. 5C. In some embodiments, single wall nanotubes, such as carbon nanotubes, BN nanotubes or TMD nanotubes formed by CVD are placed over a substrate. Then, source materials, such as source gases, are provided over the substrate with the seed nanotubes. In a case of CVD for forming a MoS$_2$ layer, a Mo(CO)$_6$ gas, a MoCl$_5$ gas, and/or a MoOCl$_4$ gas are used as a Mo source, and a H$_2$S gas and/or a dimethylsulfide gas are used as a S source, in some embodiments. In other embodiments, a MoO$_3$ gas sublimed from a solid MoO$_3$ or a MoCl$_5$ source and/or S gas sublimed from a solid S source can be used, as shown in FIG. 5C. As shown in FIG. 5C, solid sources of Mo and S are placed in a reaction chamber and a carrier gas containing inert gas, such as Ar, N$_2$ and/or He flows in the reaction chamber. The solid sources are heated to generate gaseous sources by sublimation, and the generated gaseous sources react to form MoS$_2$ molecules. The MoS$_2$ molecules are then deposited around the seed nanotubes over the substrate. The substrate is appropriately heated in some embodiments. In other embodiments, the entire reaction chamber is heated by induction heating. Other TMD layers can also be formed by CVD using suitable source gases. For example, metal oxides, such as WO$_3$, PdO$_2$ and PtO$_2$ can be used as a sublimation source for W, Pd and Pt, respectively, and metal compounds, such as W(CO)$_6$, WF$_6$, WOCl$_4$, PtCl$_2$ and PdCl$_2$ can also be used as a metal source.

Figure 5D:
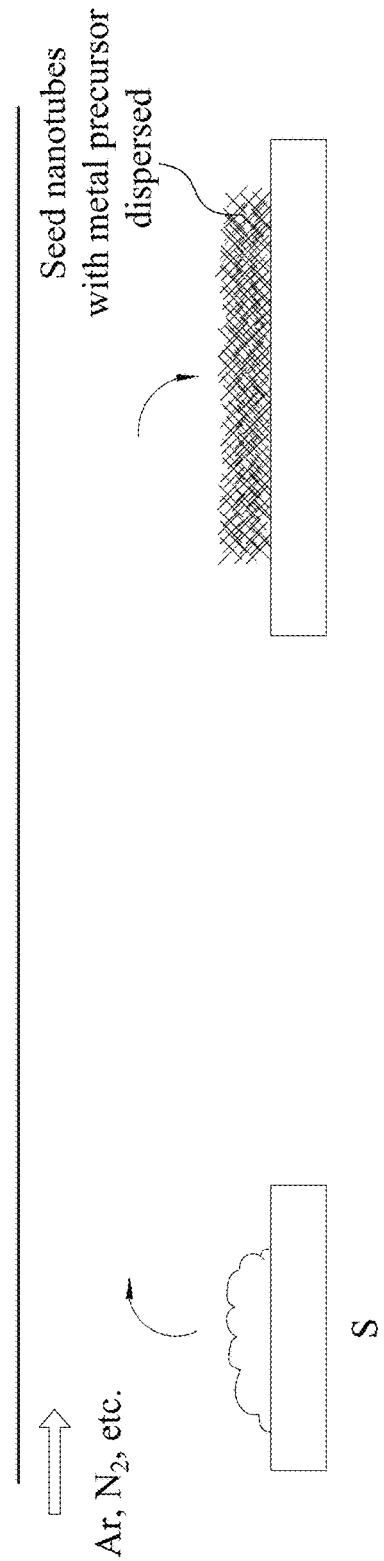

In other embodiments, as shown in FIG. 5D, the seed nanotubes are immersed in, dispersed in or treated by, one or more metal precursor, such as (NH$_4$)WS$_4$, WO$_3$, (NH$_4$)MoS$_4$ or MoO$_3$ and placed over the substrate, and then a sulfur gas is provided over the substrate to form multiwall nanotubes.

In other embodiments, a carbon source gas is used to form a carbon nanotube as an outer layer over a BN or TMD inner nanotube. Three or more co-axial nanotubes are formed by repeating above processes in some embodiments. In some embodiments, multiwall nanotubes are disposed in the solution as shown in FIG. 5A. In some embodiments, a mixture of single wall nanotubes and multiwall nanotubes are disposed in the solution.

Figure 6:
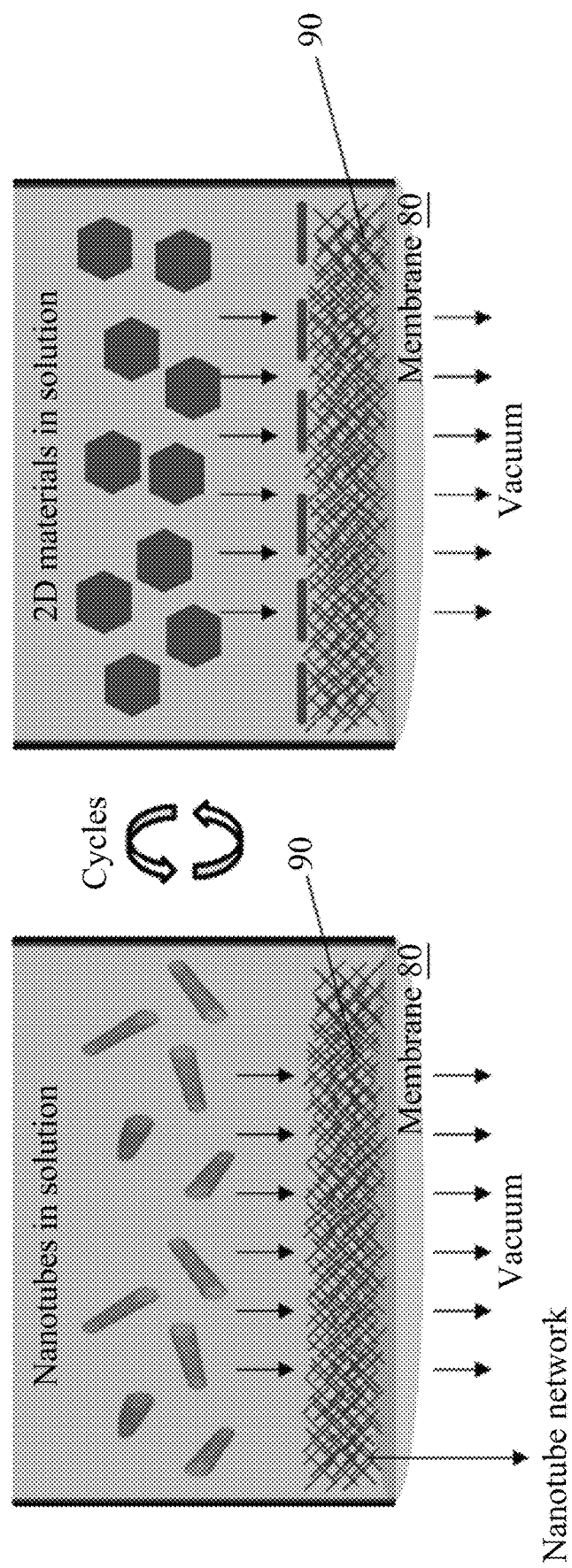
FIG. 6 shows a manufacturing process of a network membrane in accordance with an embodiment of the present disclosure.

FIG. 6 shows a manufacturing process of a network membrane in accordance with an embodiment of the present disclosure. When the main network membrane 100 includes nanotubes and two-dimensional material flakes, the deposition by filtration for nanotubes and the deposition by filtration for the flakes are repeated as shown in FIG. 6. In some embodiments, a mixture of single and/or multiwall nanotubes and flakes are dispersed in the solvent, and the deposition by filtration is performed to form a mixed network layer of nanotubes and two-dimensional material flakes.

Two-dimensional material layer(s) are formed over a substrate by a CVD method, and then the deposited layer is peeled off from the substrate. After the two-dimensional material layer is peeled off, the layer is crushed into flakes in some embodiments.

FIGS. 7A and 7B to 11A and 11B show cross sectional views (the "A" figures) and plan (top) views (the "B" figures) of the various stages for manufacturing a pellicle for an EUV photo mask in accordance with an embodiment of the present disclosure. It is understood that additional operations can be provided before, during, and after the processes shown by FIGS. 7A-11B, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

As shown in FIG. 5A-5D or 6, a nanotube layer 90 is formed on a support membrane 80 by deposition by filtering.

Figure 7B:
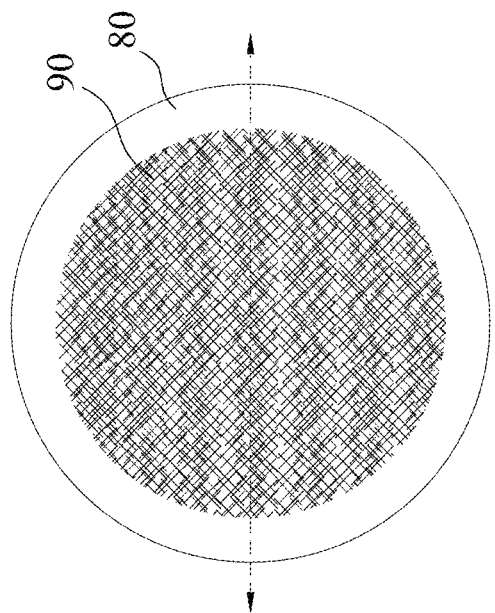
FIGS. 7A and 7B show a cross sectional view and a plan (top) view of one of the various stages for manufacturing a pellicle for an EUV photo mask in accordance with an embodiment of the present disclosure.
Figure 7A:
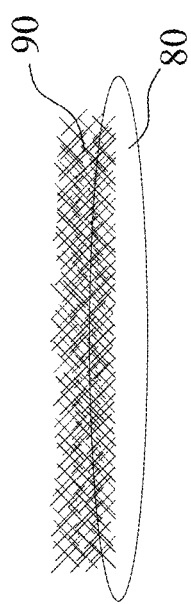

In some embodiments, the nanotube layer 90 include single wall nanotubes only. The nanotube layer 90 is then detached from a deposition apparatus, as shown in FIGS. 7A and 7B.

Figure 8B:
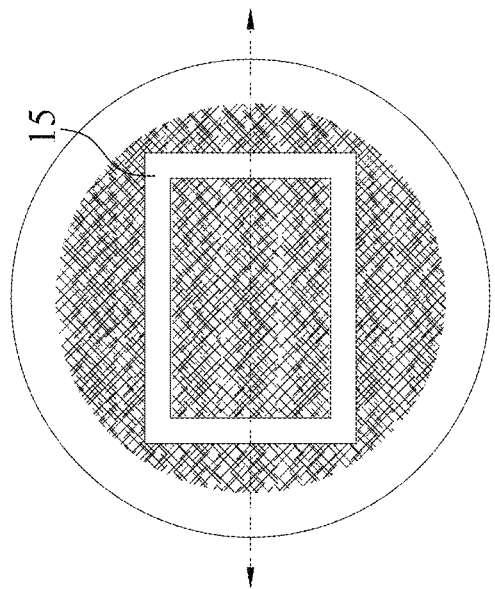
FIGS. 8A and 8B show a cross sectional view and a plan (top) view of one of the various stages for manufacturing a pellicle for an EUV photo mask in accordance with an embodiment of the present disclosure.
Figure 8A:
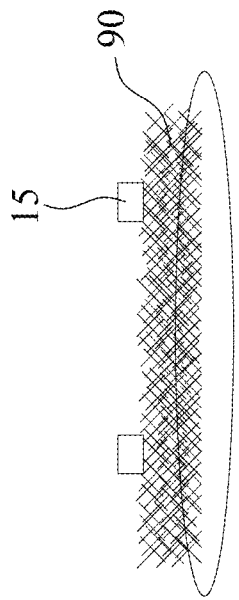

Then, as shown in FIGS. 8A and 8B, a support frame 15 is attached to the nanotube layer 90. In some embodiments, the support frame 15 is formed of one or more layers of crystalline silicon, polysilicon, silicon oxide, silicon nitride, ceramic, metal or organic material. In some embodiments, as shown in FIG. 8B, the support frame 15 has a rectangular (including square) frame shape, which is larger than the black border area of an EUV mask and smaller than the substrate of the EUV mask.

Figure 9A:
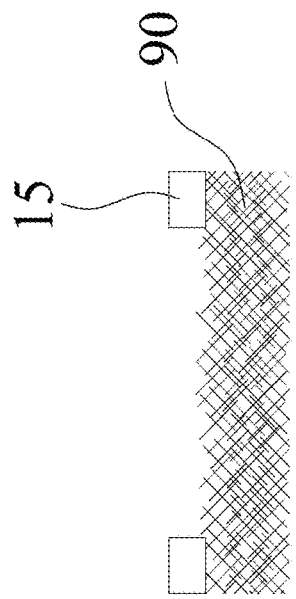
FIGS. 9A and 9B show a cross sectional view and a plan (top) view of one of the various stages for manufacturing a pellicle for an EUV photo mask in accordance with an embodiment of the present disclosure.
Figure 9B:
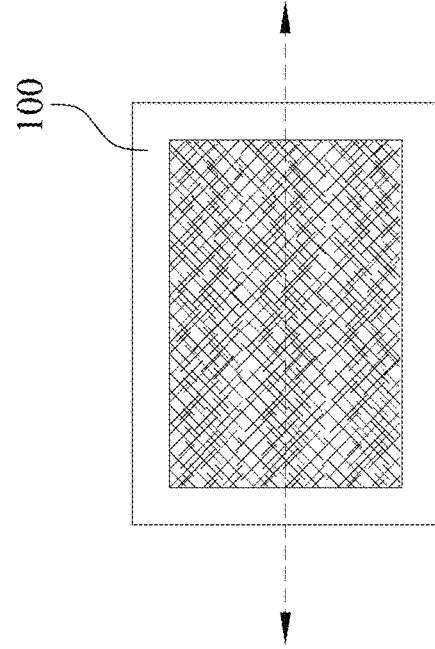

Next, as shown in FIGS. 9A and 9B, the nanotube layer 90 and the support membrane 80 are cut into a rectangular shape having the same size as or slightly larger than the support frame 15, and then the support substrate 80 is detached or removed, in some embodiments. When the support substrate 80 is made of an organic material, the support substrate 80 is removed by wet etching using an organic solvent.

Then, one or more outer tubes are formed around each of the nanotubes (e.g., single nanotubes) of the nanotube layer forming network membrane 100 including multiwall nanotubes. In some embodiments, a CVD process is performed similar to FIG. 5C or 5D using the nanotube layer 90 as seed layer. The CVD process is repeated a desired number of times to form three or more outer tubes.

Figure 11C:
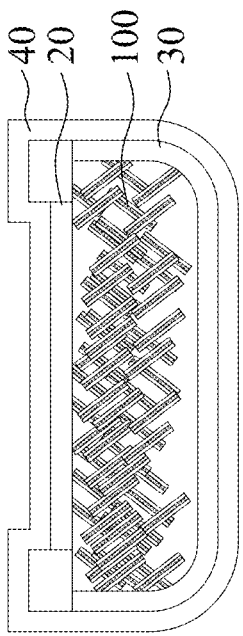
FIG. 11C shows a cross sectional view of one of the various stages for manufacturing a pellicle for an EUV photo mask in accordance with embodiments of the present disclosure.
Figure 11D:
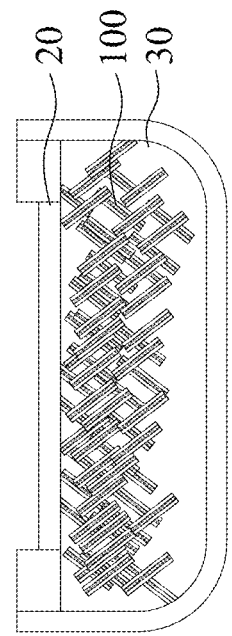
FIG. 11D shows a cross sectional view of one of the various stages for manufacturing a pellicle for an EUV photo mask in accordance with embodiments of the present disclosure.
Figure 11A:
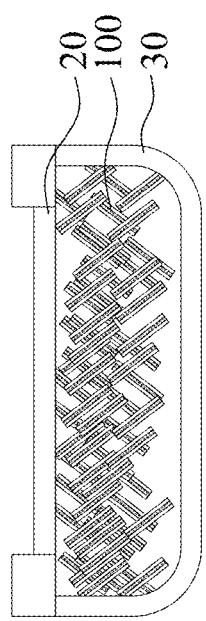
FIGS. 11A and 11B show a cross sectional view and a plan (top) view of one of the various stages for manufacturing a pellicle for an EUV photo mask in accordance with an embodiment of the present disclosure.
Figure 11B:
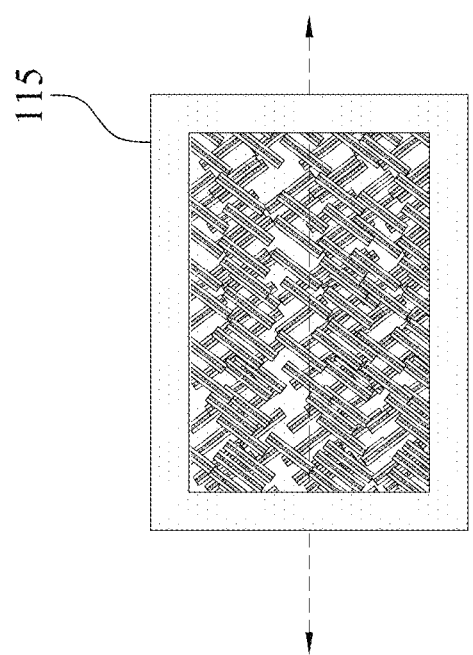

Further, as shown in FIGS. 11A and 11B, a first cover layer 20 and a second cover layer 30 are formed to seal the nanotube network layer 100. One of or both of the first cover layer 20 and the second cover layer include a two-dimensional material. The two dimensional material is formed by, for example, a CVD method on a substrate, and then the deposited two-dimensional layer(s) is peeled off from the substrate. The peeled two-dimensional layer(s) is subsequently transferred over the nanotube network layer 100.

In some embodiments, the first and/or second cover layer includes a two dimensional TMD layer, where a TMD layer represented by MX$_2$ is formed by CVD. In some embodiments, a MoS$_2$ layer is formed by CVD using source gases, such as a Mo(CO)$_6$ gas, a MoCl$_5$ gas, and/or a MoOCl$_4$ gas as a Mo source; and a H$_2$S gas and/or a dimethyl sulfide gas as a S source. In other embodiments, a MoO$_3$ gas is sublimed from a solid MoO$_3$ or a MoCl$_5$ source and/or S gas is sublimed from a solid S source. Solid sources of Mo and S are placed in a reaction chamber and a carrier gas containing inert gas, such as Ar, N$_2$ and/or He flows in the reaction chamber. The solid sources are heated to generate gaseous sources by sublimation, and the generated gaseous sources react to form MoS$_2$ molecules. The MoS$_2$ molecules are then deposited on the substrate. The substrate is appropriately heated in some embodiments. In other embodiments, the entire reaction chamber is heated by induction heating. Other TMD layers can also be formed by CVD using suitable source gases. For example, metal oxides, such as WO$_3$, PdO$_2$ and PtO$_2$ can be used as a sublimation source for W, Pd and Pt, respectively, and metal compounds, such as W(CO)$_6$, WF$_6$, WOCl$_4$, PtCl$_2$ and PdCl$_2$ can also be used as a metal source. In some embodiments, the substrate on which the TMD two-dimensional layer is formed, includes one of Si (101), γ-Al$_2$O$_3$ (101), Ga$_2$O$_3$ (010) or MgO (101). In other embodiments, a layer of hexagonal boron nitride (h-BN) or graphene is formed as the first cover layer 20 over a substrate by CVD. In some embodiments, the substrate includes one of SiC (0001), Si (111), or Ge (111).

In some embodiments, as shown in FIG. 11C, a cover layer 40 is further formed over the first and second cover layers and the support frame 15 by using CVD, ALD or any other suitable film formation methods.

In some embodiments, the second cover layer 30 is attached to the sides of the first cover layer 20 and the support frame 15 as shown in FIG. 11D.

FIGS. 12A and 12B to 14A and 14B and 15A show cross sectional views (the "A" figures) and plan (top) views (the "B" figures) of the various stages for manufacturing a pellicle for an EUV photo mask in accordance with an embodiment of the present disclosure. It is understood that additional operations can be provided before, during, and after the processes shown by FIGS. 12A-14B, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

Figure 12A:
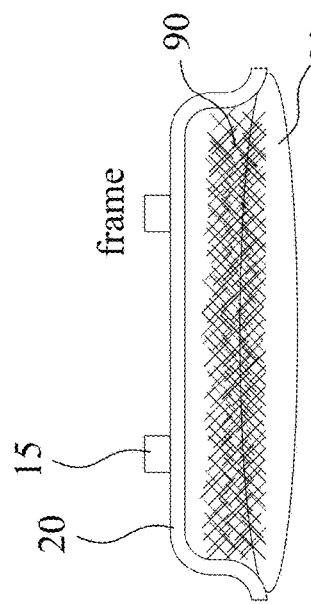
FIGS. 12A and 12B show a cross sectional view and a plan (top) view of one of the various stages for manufacturing a pellicle for an EUV photo mask in accordance with an embodiment of the present disclosure.
Figure 12B:
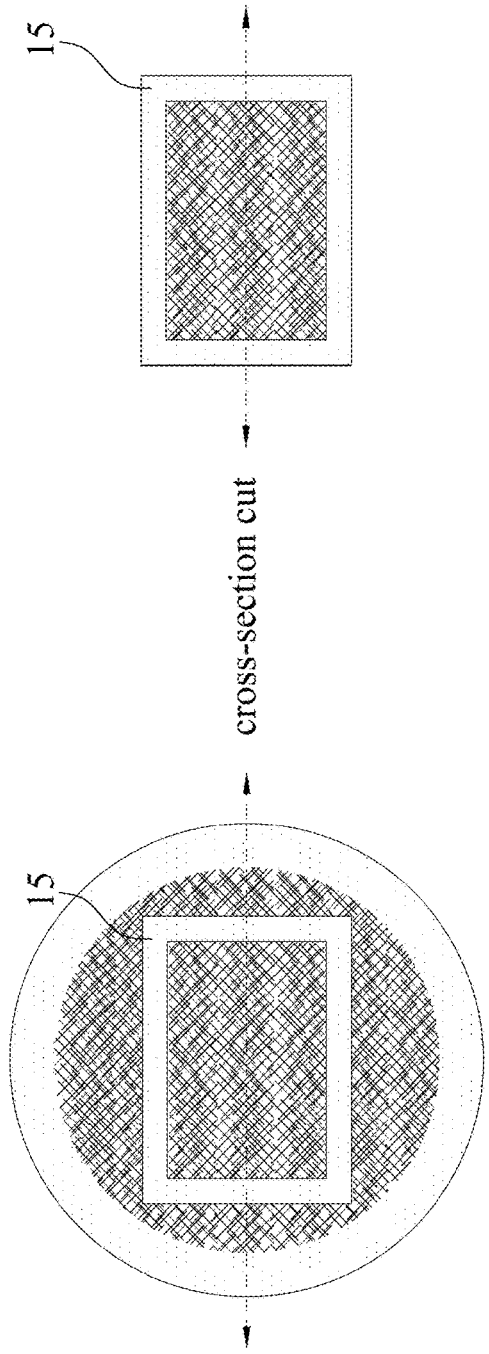

After the nanotube layer 90 is formed over the support substrate 80 as shown in FIGS. 7A and 7B, a first cover layer 20 is formed over the nanotube layer 90 as shown in FIGS. 12A and 12B. Then, as shown in FIGS. 12A and 12B, a support frame 15 is attached to the first cover layer 20.

Figure 13A:
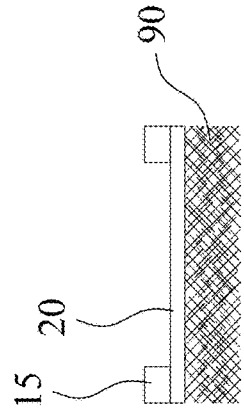
FIGS. 13A and 13B show a cross sectional view and a plan (top) view of one of the various stages for manufacturing a pellicle for an EUV photo mask in accordance with an embodiment of the present disclosure.
Figure 13B:
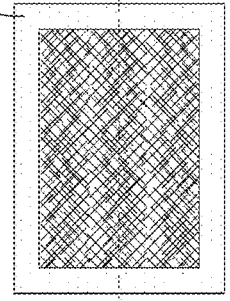

Next, as shown in FIGS. 13A and 13B, the first cover layer 20, the nanotube layer 90 and the support membrane 80 are cut into a rectangular shape having the same size as or slightly larger than the support frame 15, and then the support substrate 80 is detached or removed, in some embodiments.

Figure 10A:
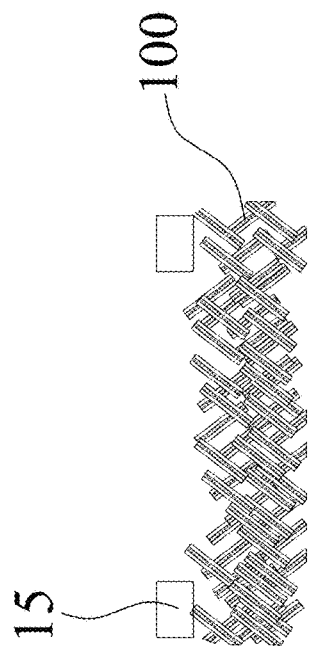
FIGS. 10A and 10B show a cross sectional view and a plan (top) view of one of the various stages for manufacturing a pellicle for an EUV photo mask in accordance with an embodiment of the present disclosure.
Figure 10B:
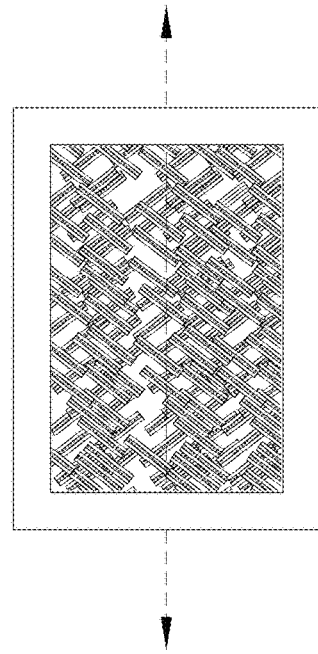
Figure 14A:
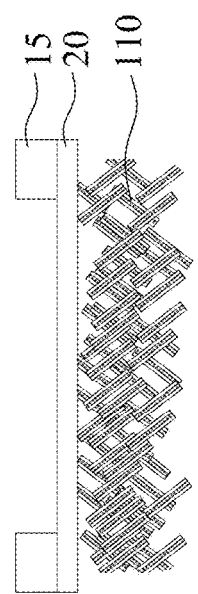
FIGS. 14A and 14B show a cross sectional view and a plan (top) view of one of the various stages for manufacturing a pellicle for an EUV photo mask in accordance with an embodiment of the present disclosure.
Figure 14B:
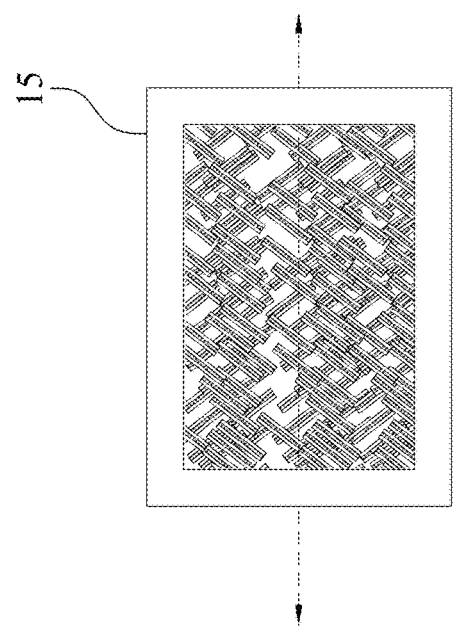

Then, similar to the operations explained with respect to FIGS. 10A and 10B, one or more outer tubes are formed over the nanotubes of the nanotube layer 90, as shown in FIGS. 14A and 14B.

Figure 15A:
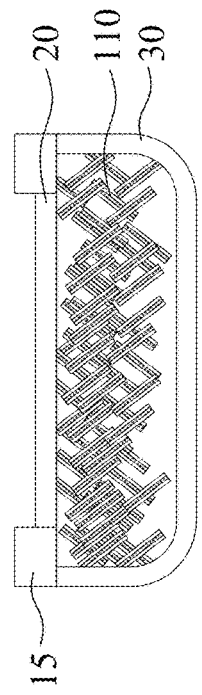
FIGS. 15A, 15B and 15C show cross sectional views of one of the various stages for manufacturing a pellicle for an EUV photo mask in accordance with embodiments of the present disclosure.

Further, similar to FIGS. 11A and 11B, a second cover layer 30 is formed over the nanotube layer 90, as shown in FIG. 15A. The operations for forming the second cover layer 30, which is a two-dimensional material, is the same as or similar to those for the first cover layer 20 as set forth above. In some embodiments, the first cover layer 20 and the second cover layer 30 are sealed at the periphery thereof to fully encapsulate the nanotube layer 90.

Figure 15B:
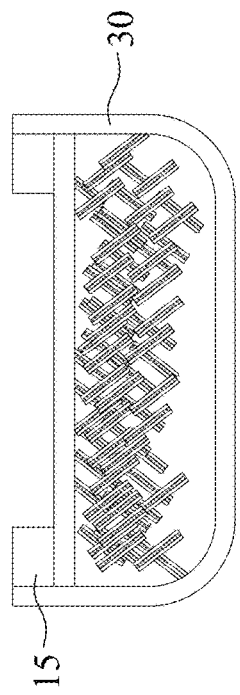
Figure 15C:
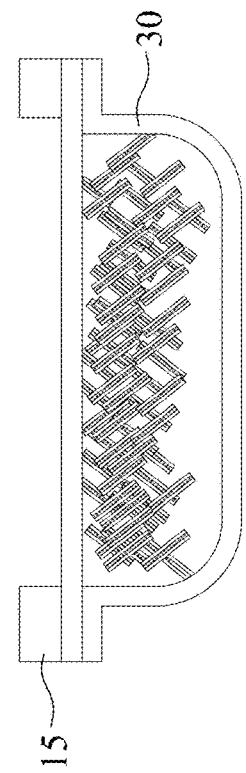

In some embodiments, the second cover layer 30 is attached to the sides of the first cover layer 20 and the support frame 15 as shown in FIG. 15B. In some embodiments, the second cover layer 30 has a flange portion at which the second cover layer 30 is fixed or bonded to the first cover layer 20, as shown in FIG. 15C.

Further, similar to FIG. 11C, a protection layer 40 is formed over the first cover layer 20, the second cover layer and the support frame 15. In some embodiments, the protection layer 40 is formed by CVD, physical vapor deposition (PVD) or atomic layer deposition (ALD).

In some embodiments, when multiwall nanotubes are dispersed in the solution in the filter-deposition operation shown in FIG. 5A or 6, a nanotube layer 91 including multiwall nanotubes is formed over the support substrate 80 as shown in FIG. 16A. In some embodiments, as shown in FIG. 16B, after the nanotube layer 90 including single wall nanotubes is formed over the support substrate similar to FIG. 7A, the single nanotubes are converted to multiwall nanotubes over the support substrate 80. After the nanotube layer 91 including multiwall nanotubes is formed over the support substrate, the operations as explained with respect to FIGS. 8A, 8B, 9A, 9B, 11A and 11B (and 11C) or FIGS. 12A, 12B, 13A, 13B and 15A are performed.

Figure 17B:
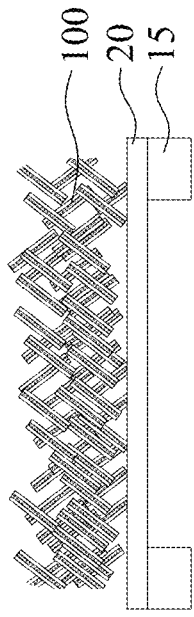
FIGS. 17A, 17B, 17C and 17D show cross sectional views of a pellicle for an EUV photo mask in accordance with embodiments of the present disclosure.
Figure 17A:
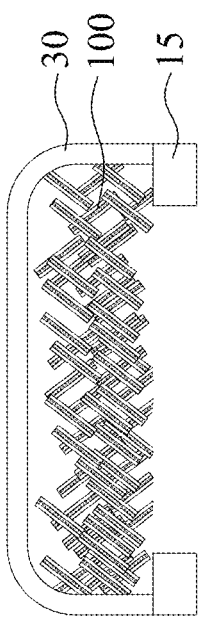
Figure 17D:
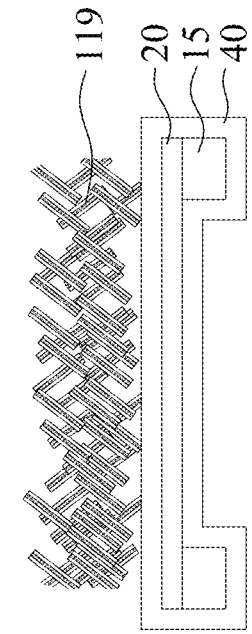
Figure 17C:
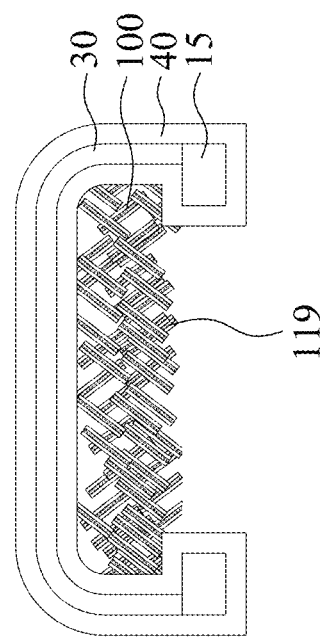

FIGS. 17A, 17B, 17C and 17D show various views of pellicles for an EUV photo mask in accordance with an embodiment of the present disclosure. In some embodiments, the first cover layer is not used and only the second cover layer 30 is disposed over the main network membrane 100 as shown in FIG. 17A. In some embodiments, the second cover layer is not used and only the first cover layer 20 is disposed over the main network membrane 100 as shown in FIG. 17B. In some embodiments, the first cover layer is not used and only the second cover layer 30 is disposed over the main network membrane 100 and a protection layer 40 is formed on the second cover layer and network membrane 100 forming covered network layer 119 as shown in FIG. 17C. In some embodiments, the protection layer is formed around each of the multiwall nanotubes, and in other embodiments, the protection layer covers an outer periphery of the main network membrane 100. In some embodiments, the second cover layer is not used and only the first cover layer 20 is disposed over the main network membrane 100 and a protection layer 40 is formed on the second cover layer and network membrane 100 forming covered network layer 119 as shown in FIG. 17D. In some embodiments, the protection layer is formed around each of the multiwall nanotubes, and in other embodiments, the protection layer covers an outer periphery of the main network membrane 100.

FIGS. 18A, 18B, 18C, 18D, 18E and 18F show flowcharts of manufacturing a pellicle for an EUV photo mask in accordance with embodiments of the present disclosure. It is understood that additional operations can be provided before, during, and after the process blocks shown by FIGS. 18A-18F, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

Figures 18A, 18B:
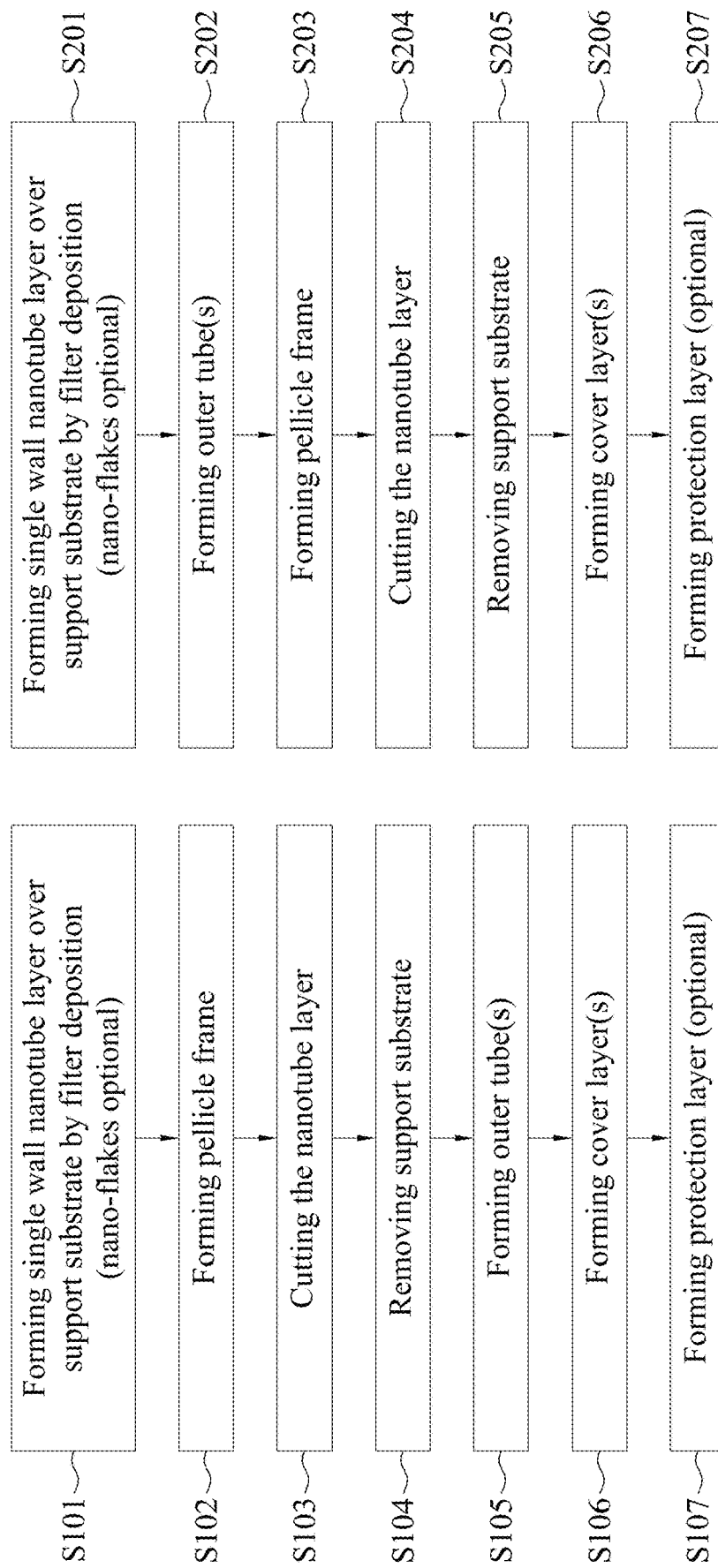

In some embodiments, as shown in FIG. 18A, a nanotube layer including single wall nanotubes is formed over a support substrate by a filter-deposition method at block S101. Then, at block S102, a pellicle frame is formed over the nanotube layer. At block S103, the nanotube layer and the support substrate are cut into a desired shape, and at block S104, the support substrate is removed. At block S105, one or more outer tubes are formed around single wall nanotubes, respectively. At block S106, one or more cover layers made of a two-dimensional material are formed to seal the multiwall nanotube layer. At block S107, a protection layer is optionally formed over the cover layers.

In some embodiments, as shown in FIG. 18B, a nanotube layer including single wall nanotubes is formed over a support substrate by a filter-deposition method at block S201. Then, at block S202, one or more outer tubes are formed around the single wall nanotubes, respectively. At block S203, a pellicle frame is formed over the multiwall nanotube layer. At block S204, the multiwall nanotube layer and the support substrate are cut into a desired shape, and at block S205, the support substrate is removed. At block S206, one or more cover layers made of a two-dimensional material are formed to seal the multiwall nanotube layer. At block S207, a protection layer is optionally formed over the cover layers.

In some embodiments, as shown in FIG. 18C, a nanotube layer including single wall nanotubes is formed over a support substrate by a filter-deposition method at block S301. Then, at block S302, a first cover layer made of a two-dimensional material is formed over the nanotube layer on the support substrate. At block S303, a pellicle frame is formed over the first cover layer. At block S304, the nanotube layer and the support substrate are cut into a desired shape, and the support substrate is removed. At block S305, one or more outer tubes are formed around single wall nanotubes, respectively. At block S306, a second cover layer made of a two-dimensional material is formed to seal the multiwall nanotube layer. At block S307, a protection layer is optionally formed over the cover layers.

In some embodiments, as shown in FIG. 18D, a nanotube layer including single wall nanotubes is formed over a support substrate by a filter-deposition method at block S401. Then, at block S402, one or more outer tubes are formed around the single wall nanotubes, respectively. At block S403, a first cover layer made of a two-dimensional material is formed over the nanotube layer on the support substrate. At block S404, a pellicle frame is formed over the first cover layer. At block S405, the multiwall nanotube layer and the support substrate are cut into a desired shape, and the support substrate is removed. At block S406, a second cover layer made of a two-dimensional material are formed to seal the multiwall nanotube layer. At block S407, a protection layer is optionally formed over the cover layers.

Figures 18E, 18F:
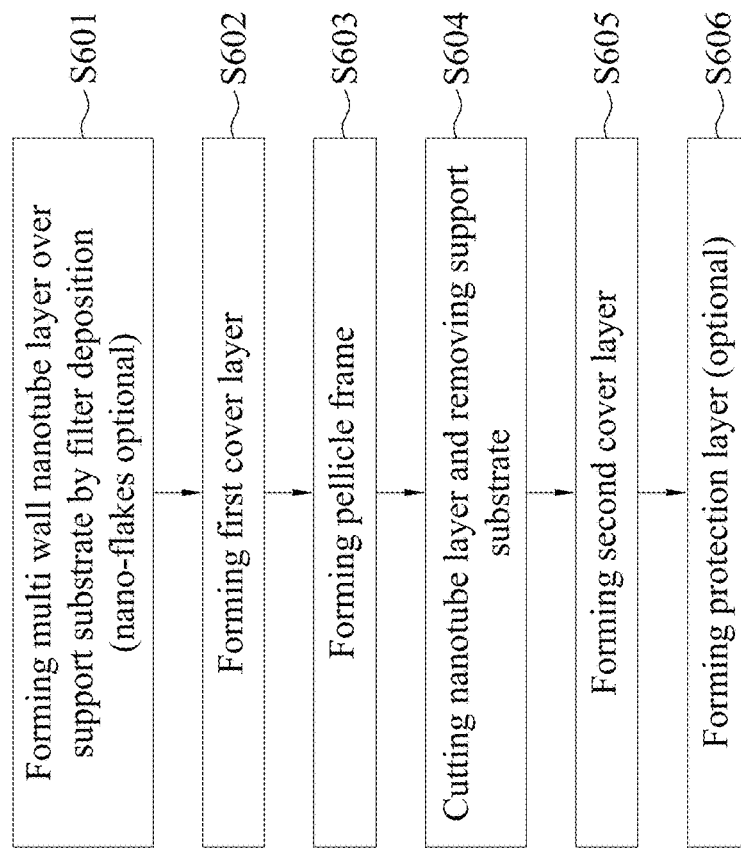

In some embodiments, as shown in FIG. 18E, a nanotube layer including multiwall wall nanotubes is formed over a support substrate by a filter-deposition method at block S501. Then, at block S502, a pellicle frame is formed over the multiwall nanotube layer. At block S503, the multiwall nanotube layer and the support substrate are cut into a desired shape, and at block S504, the support substrate is removed. At block S505, one or more cover layers made of a two-dimensional material are formed to seal the multiwall nanotube layer. At block S506, a protection layer is optionally formed over the cover layers. In some embodiments, one or more additional outer tubes are formed around the multiwall nanotubes, respectively, between the blocks S501 and S502, and/or between the blocks S504 and S505.

In some embodiments, as shown in FIG. 18F, a nanotube layer including multiwall wall nanotubes is formed over a support substrate by a filter-deposition method at block S601. Then, at block S602, a first cover layer is formed over the multiwall nanotube layer on the support substrate. At block S603, a pellicle frame is formed over the first cover layer. At block S604, the multiwall nanotube layer and the support substrate are cut into a desired shape, and the support substrate is removed. At block S605, a second cover layer made of a two-dimensional material is formed to seal the multiwall nanotube layer. At block S606, a protection layer is optionally formed over the cover layers. In some embodiments, one or more additional outer tubes are formed around the multiwall nanotubes, respectively, between the blocks S601 and S602, and/or between the blocks S604 and S605.

Figure 19A:
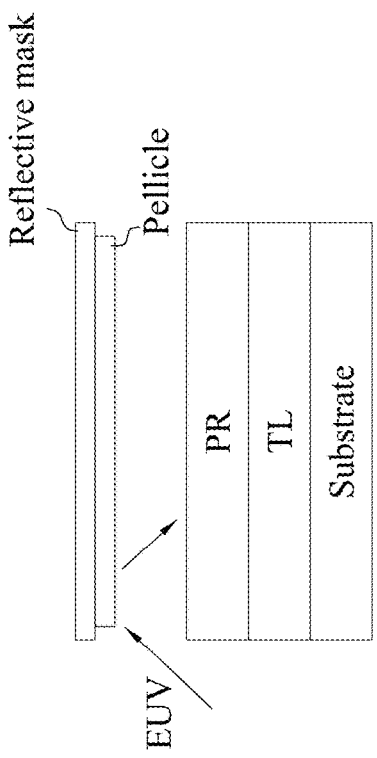
FIG. 19A shows a flowchart of a method making a semiconductor device.
Figure 19B:
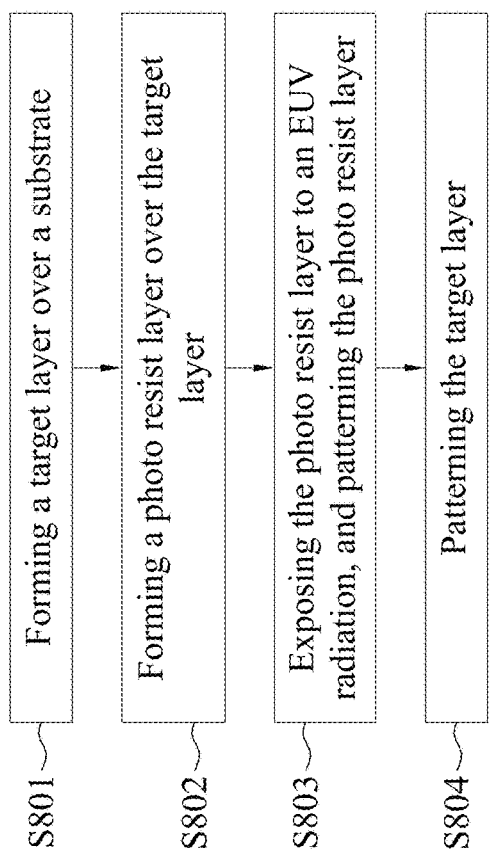
FIGS. 19B, 19C, 19D and 19E show a sequential manufacturing operation of a method of making a semiconductor device in accordance with embodiments of present disclosure.
Figure 19C:
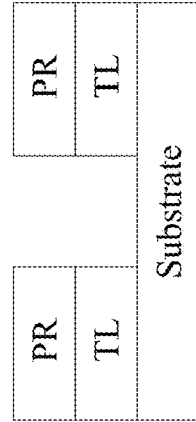

FIG. 19A shows a flowchart of a method of making a semiconductor device, and FIGS. 19B, 19C, 19D and 19E show a sequential manufacturing method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 19A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S802 of FIG. 19A, a photo resist layer is formed over the target layer, as shown in FIG. 19B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S803 of FIG. 19A, the photo resist layer is patterned using an EUV reflective mask with a pellicle as set forth above, as shown in FIG. 19C. The patterning of the photo resist layer includes performing a photolithography exposing process by an EUV exposing system using the EUV mask. During the exposing process, the integrated circuit (IC) design pattern defined on the EUV mask is imaged to the photo resist layer to form a latent pattern thereon. The patterning of the photo resist layer further includes developing the exposed photo resist layer to form a patterned photo resist layer having one or more openings. In one embodiment where the photo resist layer is a positive tone photo resist layer, the exposed portions of the photo resist layer are removed during the developing process. The patterning of the photo resist layer may further include other process steps, such as various baking steps at different stages. For example, a post-exposure-baking (PEB) process may be implemented after the photolithography exposing process and before the developing process.

Figure 19D:
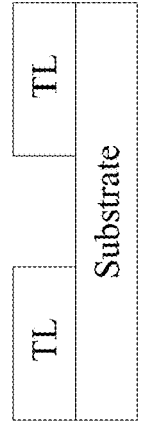
Figure 19E:
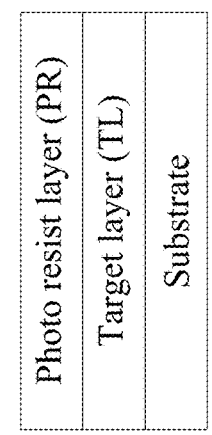

At S804 of FIG. 19A, the target layer is patterned utilizing the patterned photo resist layer as an etching mask, as shown in FIG. 19D. In some embodiments, the patterning the target layer includes applying an etching process to the target layer using the patterned photo resist layer as an etch mask. The portions of the target layer exposed within the openings of the patterned photo resist layer are etched while the remaining portions are protected from etching. Further, the patterned photo resist layer may be removed by wet stripping or plasma ashing, as shown in FIG. 19E.

The pellicles according to embodiments of the present disclosure provide higher strength and thermal conductivity (dissipation) as well as higher EUV transmittance than conventional pellicles. In the foregoing embodiments, multiwall nanotubes are used as a main network membrane to increase the mechanical strength of the pellicle and obtain a high EUV transmittance. Further, a two-dimensional material layer is used as a cover layer (first and/or second cover layers) and/or used together with nanotubes to increase the mechanical strength of a pellicle. In addition, by using a two-dimensional material layer and/or a protection layer to enclose the main network membrane, it is possible to increase the mechanical strength of the pellicle and provide a high or perfect blocking property of killer particles. Moreover, the use of the two-dimensional material flakes improves heat dissipation to prevent a pellicle from being burnt out by EUV radiation in some embodiments.

It will be understood that not all advantages have been necessarily discussed herein, no particular advantage is required for all embodiments or examples, and other embodiments or examples may offer different advantages.

In accordance with one aspect of the present disclosure, a pellicle for an EUV photo mask includes a first layer, a second layer, and a main membrane disposed between the first layer and second layer. The main membrane includes a plurality of co-axial nanotubes, each of which includes an inner tube and one or more outer tubes surrounding the inner tube, and two of the inner tube and one or more outer tubes are made of different materials from each other. In one or more of the foregoing and following embodiments, each of the inner tube and the one or more outer tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing and following embodiments, the inner tube is a carbon nanotube. In one or more of the foregoing and following embodiments, each of the plurality of co-axial nanotubes includes the inner tube and one outer tube made of a different material than the inner tube. In one or more of the foregoing and following embodiments, each of the plurality of co-axial nanotubes includes the inner tube and two outer tubes, all of which are made of different materials from each other. In one or more of the foregoing and following embodiments, each of the plurality of co-axial nanotubes includes two outer tubes made of a same material and the inner tube. In one or more of the foregoing and following embodiments, the main membrane further includes a plurality of single wall nanotubes.

In accordance with another aspect of the present disclosure, a pellicle for an extreme ultraviolet (EUV) reflective mask includes a first layer, a support frame attached to the first layer, and a main membrane disposed over the first layer. The main membrane includes a plurality of nanotubes, each of which includes an inner nanotube and first to N-th outer layers each coaxially surrounding the inner nanotube, where N is a natural number from 1 to 10. In one or more of the foregoing and following embodiments, at least one of the first to the N-th outer layers is a nanotube coaxially surrounding the inner nanotube. In one or more of the foregoing and following embodiments, two of the inner nanotube and the first to the N-th outer layers are made of different materials from each other. In one or more of the foregoing and following embodiments, N is at least two, and two of the inner nanotube and the first to the N-th outer layers are made of a same materials. In one or more of the foregoing and following embodiments, N is at least two, and three of the inner nanotube and the first to the N-th outer layers are made of different materials from each other. In one or more of the foregoing and following embodiments, the inner nanotube is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing and following embodiments, each of the first to the N-th outer layers is made of a carbon, boron nitride, transition metal dichalcogenide (TMD), where TMD is represented by $MX_2$, where M is one or more of Mo, W, Pd, Pt, or Hf, and X is one or more of S, Se or Te. In one or more of the foregoing and following embodiments, the pellicle further includes a protection layer. In one or more of the foregoing and following embodiments, a material of the protection layer is the same as the N-th outer layer.

In accordance with another aspect of the present disclosure, a pellicle for an extreme ultraviolet (EUV) reflective mask includes a first layer, a second layer, and a main membrane disposed between the first layer and second layer. The main membrane includes a plurality of nanotubes, each of which includes an inner nanotube and first to N-th outer tubes each coaxially surrounding the inner nanotube, where N is a natural number from 1 to 10, and at least one of the first layer or the second layer includes a two-dimensional material in which one or more two-dimensional layers are stacked. In one or more of the foregoing and following embodiments, the two-dimensional material includes at least one selected from the group consisting of boron nitride (BN), graphene, $MoS_2$, $MoSe_2$, $WS_2$, and $WSe_2$. In one or more of the foregoing and following embodiments, the main membrane further includes a plurality of nano-flakes of a two-dimensional material, which includes at least one selected from the group consisting of boron nitride (BN), graphene, $MoS_2$, $MoSe_2$, $WS_2$, and $WSe_2$. In one or more of the foregoing and following embodiments, the pellicle further includes a protection layer disposed over the first layer and the second layer. In one or more of the foregoing and following embodiments, the protection layer includes at least one selected from the group consisting of $HfO_2$, $Al_2O_3$, $ZrO_2$, $Y_2O_3$, $La_2O_3$, $B_4C$, YN, $Si_3N_4$, BN, NbN, RuNb, $YF_3$, TiN, ZrN, Ru, Nb, Y, Sc, Ni, Mo, W, Pt, and Bi.

In accordance with another aspect of the present disclosure, a pellicle for an extreme ultraviolet (EUV) reflective mask includes a first layer, a support frame attached to the first layer, and a main membrane disposed over the first layer. The main membrane includes a network structure of a plurality of multiwall nanotubes each having a plurality of coaxial tubes, and at least two of the plurality of coaxial tubes are made of different materials from each other. In one or more of the foregoing and following embodiments, each of the plurality of coaxial tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing and following embodiments, an innermost tube of the plurality of coaxial tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing and following embodiments, each of the plurality of coaxial tubes other than the innermost tube is made of carbon, boron nitride nanotube, transition metal dichalcogenide (TMD), where TMD is represented by $MX_2$, where M is one or more of Mo, W, Pd, Pt, or Hf, and X is one or more of S, Se or Te. In one or more of the foregoing and following embodiments, an outermost tube of the plurality of coaxial tubes is made of at least one selected from the group consisting of $HfO_2$, $Al_2O_3$, $ZrO_2$, $Y_2O_3$, $La_2O_3$, $B_4C$, YN, $Si_3N_4$, BN, NbN, RuNb, $YF_3$, TiN, ZrN, Ru, Nb, Y, Sc, Ni, Mo, W, Pt, and Bi. In one or more of the foregoing and following embodiments, each of the plurality of multiwall nanotubes has three or four coaxial tubes, and at least three of the three or four coaxial tubes are made of different materials from each other. In one or more of the foregoing and following embodiments, the main membrane further includes a plurality of single wall nanotubes. In one or more of the foregoing and following embodiments, the first layer includes a two-dimensional material in which one or more two-dimensional layers are stacked. In one or more of the foregoing and following embodiments, the two-dimensional material includes at least one selected from the group consisting of boron nitride (BN), graphene, and a transition metal dichalcogenide (TMD), where TMD is represented by $MX_2$, where M is one or more of Mo, W, Pd, Pt, or Hf, and X is one or more of S, Se or Te. In one or more of the foregoing and following embodiments, a thickness of the first layer is in a range from 0.3 nm to 3 nm. In one or more of the foregoing and following embodiments, a number of the one or more two-dimensional layers of the first layer is 1 to 20. In one or more of the foregoing and following embodiments, the first layer is disposed between the support frame and the main membrane. In one or more of the foregoing and following embodiments, a part of the main membrane is disposed between the first layer and the support frame. In one or more of the foregoing and following embodiments, the pellicle further includes a second layer. In one or more of the foregoing and following embodiments, the main membrane is disposed between the first layer and the second layer. In one or more of the foregoing and following embodiments, the second layer includes a two-dimensional material in which one or more two-dimensional layers are stacked. In one or more of the foregoing and following embodiments, the two-dimensional material includes at least one selected from the group consisting of boron nitride (BN), graphene, and a transition metal dichalcogenide (TMD), where TMD is represented by $MX_2$, where M is one or more of Mo, W, Pd, Pt, or Hf, and X is one or more of S, Se or Te. In one or more of the foregoing and following embodiments, a thickness of the first layer is in a range from 0.3 nm to 3 nm. In one or more of the foregoing and following embodiments, a number of the one or more two-dimensional layers of the first layer is 1 to 20. In one or more of the foregoing and following embodiments, the pellicle further includes a protection layer disposed over both sides of the first layer. In one or more of the foregoing and following embodiments, the protection layer includes at least one selected from the group consisting of $HfO_2$, $Al_2O_3$, $ZrO_2$, $Y_2O_3$, and $La_2O_3$. In one or more of the foregoing and following embodiments, the protection layer includes at least one selected from the group consisting of $B_4C$, YN, $Si_3N_4$, BN, NbN, RuNb, $YF_3$, TiN, and ZrN. In one or more of the foregoing and following embodiments, the protection layer includes a metal layer made of at least one selected from the group consisting of Ru, Nb, Y, Sc, Ni, Mo, W, Pt, and Bi. In one or more of the foregoing and following embodiments, a thickness of the protection layer is in a range from 0.1 nm to 5 nm. In one or more of the foregoing and following embodiments, the protection layer is also formed to cover the plurality of nanotubes of the main membrane. In one or more of the foregoing and following embodiments, a material of the protection layer is the same as a material of an outermost one of the plurality of coaxial tubes. In one or more of the foregoing and following embodiments, the plurality of multiwall nanotubes include a plurality of first multiwall nanotubes and a plurality of second multiwall nanotubes different from the plurality of first multiwall nanotubes. In one or more of the foregoing and following embodiments, a number of wall layers of each of the plurality of first multiwall nanotubes is different from a number of wall layers of each of the plurality of second multiwall nanotubes. In one or more of the foregoing and following embodiments, a number of wall layers of each of the plurality of first multiwall nanotubes is the same as a number of wall layers of each of the plurality of second multiwall nanotubes. In one or more of the foregoing and following embodiments, a layer structure in terms of material of each of the plurality of first multiwall nanotubes is different from a layer structure in terms of material of each of the plurality of second multiwall nanotubes. In one or more of the foregoing and following embodiments, the main membrane further includes a plurality of flakes comprising two-dimensional material in which one or more two-dimensional layers are stacked. In one or more of the foregoing and following embodiments, the two-dimensional material includes at least one selected from the group consisting of boron nitride (BN), graphene, $MoS_2$, $MoSe_2$, $WS_2$, and $WSe_2$. In one or more of the foregoing and following embodiments, a size of each of the plurality of flakes is in a range from 10 $nm^2$ to 10 $\mu m^2$. In one or more of the foregoing and following embodiments, a thickness of each of the plurality of flakes is in a range from 0.3 nm to 3 nm. In one or more of the foregoing and following embodiments, a number of the one or more two-dimensional layers of each of the plurality of flakes is 1 to 20.

In accordance with another aspect of the present disclosure, in a method of manufacturing a pellicle for an extreme ultraviolet (EUV) reflective mask, a nanotube layer including a plurality of nanotubes is formed over a support substrate. A pellicle frame is formed over the nanotube layer. The nanotube layer is detached from the support substrate. One or more outer tubes are formed around each of the plurality of nanotubes as an inner nanotube, thereby forming a network membrane including a plurality of coaxial tubes each including the inner nanotube and the one or more outer tubes each coaxially surrounding the inner nanotube. At least two of the inner nanotube and the one or more outer tubes are made of different materials from each other. In one or more of the foregoing and following embodiments, after the pellicle frame is formed and before the one or more outer tubes are formed, at least the nanotube layer is cut into a polygonal shape. In one or more of the foregoing and following embodiments, each of the plurality of coaxial tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing and following embodiments, the inner nanotube is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing and following embodiments, each of the one or more outer tubes is made of carbon, boron nitride, transition metal dichalcogenide (TMD), where TMD is represented by $MX_2$, where M is one or more of Mo, W, Pd, Pt, or Hf, and X is one or more of S, Se or Te. In one or more of the foregoing and following embodiments, each of the plurality of coaxial tubes has total three or four coaxial tubes, and at least three of the total three or four coaxial tubes are made of different materials from each other. In one or more of the foregoing and following embodiments, the network membrane further includes a plurality of single wall nanotubes.

In accordance with another aspect of the present disclosure, in a method of manufacturing a pellicle for an extreme ultraviolet (EUV) reflective mask, a nanotube layer including a plurality of multiwall nanotubes is formed, a pellicle frame is formed over the nanotube layer, and a first cover layer and a second cover layer are formed so that the nanotube layer is disposed between the first cover layer and the second cover layer. The multiwall nanotube includes an inner nanotube and one or more outer tubes, and at least one of the first cover layer and the second cover layer includes a two-dimensional material in which one or more two-dimensional layers are stacked. In one or more of the foregoing and following embodiments, the first cover layer includes a first two-dimensional material and the second cover layer includes a second two-dimensional material. In one or more of the foregoing and following embodiments, each of the first and second two-dimensional materials includes at least one selected from the group consisting of boron nitride (BN), graphene, $MoS_2$, $MoSe_2$, $WS_2$, and $WSe_2$. In one or more of the foregoing and following embodiments, the first two-dimensional material is different from the second two-dimensional material. In one or more of the foregoing and following embodiments, a thickness of each of the first cover layer and the second cover layer is in a range from 0.3 nm to 3 nm. In one or more of the foregoing and following embodiments, a number of the one or more two-dimensional layers of each of the first and second two-dimensional materials is 1 to 20. In one or more of the foregoing and following embodiments, a protection layer is formed over the first cover layer, the second cover layer and a pellicle frame. In one or more of the foregoing and following embodiments, the protection layer includes at least one selected from the group consisting of $HfO_2$, $Al_2O_3$, $ZrO_2$, $Y_2O_3$, $La_2O_3$, $B_4C$, YN, $Si_3N_4$, BN, NbN, RuNb, $YF_3$, TiN, ZrN, Ru, Nb, Y, Sc, Ni, Mo, W, Pt, and Bi.

In accordance with another aspect of the present disclosure, in a method of manufacturing a pellicle for an extreme ultraviolet (EUV) reflective mask, a nanotube layer including a plurality of nanotubes and flakes of one or more two-dimensional materials is formed over a support substrate, a pellicle frame is formed over the first cover layer, the nanotube layer is cut to form a cut pellicle membrane, and a first cover layer an a second cover layer are formed to encapsulate the cut pellicle membrane. In one or more of the foregoing and following embodiments, the nanotube layer includes a network structure of a plurality of multiwall coaxial nanotubes, and at least two tubes of the plurality of multiwall coaxial nanotubes are made of different materials from each other. In one or more of the foregoing and following embodiments, each of the one or more two-dimensional materials includes at least one selected from the group consisting of boron nitride (BN), graphene, $MoS_2$, $MoSe_2$, $WS_2$, and $WSe_2$. In one or more of the foregoing and following embodiments, a size of each of the flakes is in a range from 10 $nm^2$ to 10 $\mu m^2$. In one or more of the foregoing and following embodiments, a thickness of each of flakes is in a range from 0.3 nm to 3 nm. In one or more of the foregoing and following embodiments, a number of the one or more two-dimensional layers of each of the flakes is 1 to 20. In one or more of the foregoing and following embodiments, each of the plurality of multiwall coaxial nanotubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle for an extreme ultraviolet (EUV) reflective mask, comprising:
   a first layer;
   a second layer; and
   a main membrane disposed between the first layer and second layer, wherein:
   the main membrane includes a plurality of co-axial nanotubes, each of which includes an inner tube and one or more outer tubes surrounding the inner tube, and
   two of the inner tube and one or more outer tubes are made of different materials from each other.

2. The pellicle of claim 1, wherein each of the inner tube and the one or more outer tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te.

3. The pellicle of claim 2, wherein the inner tube is a carbon nanotube.

4. The pellicle of claim 2, wherein each of the plurality of co-axial nanotubes includes the inner tube and one outer tube made of a different material than the inner tube.

5. The pellicle of claim 2, wherein each of the plurality of co-axial nanotubes includes the inner tube and two outer tubes, all of which are made of different materials from each other.

6. The pellicle of claim 2, wherein each of the plurality of co-axial nanotubes includes two outer tubes made of a same material and the inner tube.

7. The pellicle of claim 1, wherein the main membrane further includes a plurality of single wall nanotubes.

8. A pellicle for an extreme ultraviolet (EUV) reflective mask, comprising:
   a first layer;
   a support frame attached to the first layer; and
   a main membrane disposed over the first layer,
   wherein the main membrane includes a plurality of nanotubes, each of which includes an inner nanotube and first to N-th outer layers each coaxially surrounding the inner nanotube, where N is a natural number from 1 to 10.

9. The pellicle of claim 8, wherein at least one of the first to the N-th outer layers is a nanotube coaxially surrounding the inner nanotube.

10. The pellicle of claim 8, wherein two of the inner nanotube and the first to the N-th outer layers are made of different materials from each other.

11. The pellicle of claim 10, wherein:
    N is at least two, and
    two of the inner nanotube and the first to the N-th outer layers are made of a same material.

12. The pellicle of claim 8, wherein:
    N is at least two, and
    three of the inner nanotube and the first to the N-th outer layers are made of different materials from each other.

13. The pellicle of claim 8, wherein the inner nanotube is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te.

14. The pellicle of claim 13, wherein each of the first to the N-th outer layers is made of a carbon, boron nitride, transition metal dichalcogenide (TMD), where TMD is represented by $MX_2$, where M is one or more of Mo, W, Pd, Pt, or Hf, and X is one or more of S, Se or Te.

15. The pellicle of claim 8, further comprising a protection layer,
wherein a material of the protection layer is the same as the N-th outer layer.

16. A method of manufacturing a pellicle for an extreme ultraviolet (EUV) reflective mask, comprising:
forming a nanotube layer including a plurality of nanotubes over a support substrate;
forming a pellicle frame over the nanotube layer;
detaching the nanotube layer from the support substrate; and
forming one or more outer tubes around each of the plurality of nanotubes as an inner nanotube, thereby forming a network membrane comprising a plurality of coaxial tubes each including the inner nanotube and the one or more outer tubes each coaxially surrounding the inner nanotube,
wherein at least two of the inner nanotube and the one or more outer tubes are made of different materials from each other.

17. The method of claim 16, further comprising after the pellicle frame is formed and before the one or more outer tubes are formed, cutting at least the nanotube layer into a polygonal shape.

18. The method of claim 16, wherein each of the plurality of coaxial tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te.

19. The method of claim 16, wherein the inner nanotube is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te.

20. The method of claim 19, wherein each of the one or more outer tubes is made of carbon, boron nitride, transition metal dichalcogenide (TMD), where TMD is represented by $MX_2$, where M is one or more of Mo, W, Pd, Pt, or Hf, and X is one or more of S, Se or Te.

* * * * *